(12) United States Patent
Kato

(10) Patent No.: US 10,122,068 B2
(45) Date of Patent: Nov. 6, 2018

(54) WIRELESS IC DEVICE, MOLDED RESIN ARTICLE, AND METHOD FOR MANUFACTURING COIL ANTENNA

(71) Applicant: Murata Manufacturing Co., Ltd., Nagaokakyo-shi, Kyoto-fu (JP)

(72) Inventor: Noboru Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 68 days.

(21) Appl. No.: 15/337,270

(22) Filed: Oct. 28, 2016

(65) Prior Publication Data

US 2017/0047634 A1 Feb. 16, 2017

Related U.S. Application Data

(63) Continuation of application No. PCT/JP2015/070018, filed on Jul. 13, 2015.

(30) Foreign Application Priority Data

Aug. 27, 2014 (JP) .................. 2014-172751
Nov. 28, 2014 (JP) .................. 2014-240692
May 15, 2015 (WO) ............. PCT/JP2015/063974

(51) Int. Cl.
 *H01Q 1/22* (2006.01)
 *G06K 19/077* (2006.01)
 (Continued)

(52) U.S. Cl.
 CPC .......... *H01Q 1/2283* (2013.01); *G06K 19/077* (2013.01); *H01Q 1/38* (2013.01);
 (Continued)

(58) Field of Classification Search
 CPC .......... H01Q 1/2283; H01Q 1/38; H01Q 7/00; G06K 19/077; H01L 2224/16225; H01L 2924/19105
 See application file for complete search history.

(56) References Cited

U.S. PATENT DOCUMENTS 5,567,537 A 10/1996 Yoshizawa et al.
2011/0128992 A1 6/2011 Maeda et al.
(Continued)

FOREIGN PATENT DOCUMENTS

JP 2002-288609 A 10/2002
JP 3891448 B2 3/2007
(Continued)

OTHER PUBLICATIONS

Official Communication issued in International Patent Application No. PCT/JP2015/063974, dated Jun. 16, 2015.
(Continued)

*Primary Examiner* — Dameon E Levi
*Assistant Examiner* — David Lotter
(74) *Attorney, Agent, or Firm* — Keating & Bennett, LLP

(57) ABSTRACT

A wireless IC device including a coil antenna includes a first substrate, a first metal post, a second metal post, and a connection conductor. First conductor patterns are provided on a first principal surface of the first substrate. The first metal post and the second metal post extend in a normal direction to the first principal surface of the first substrate, and first ends thereof are connected to the first-principal-surface-side conductor patterns. A first end of second conductor pattern is connected to a second end of the first metal post, and a second end of the connection conductor is connected to a second end of the second metal post. A second end of the first-principal-surface-side conductor patterns are power supply ends.

18 Claims, 31 Drawing Sheets

(51) Int. Cl.
*H01Q 1/38* (2006.01)
*H01Q 7/00* (2006.01)

(52) U.S. Cl.
CPC ..... *H01Q 7/00* (2013.01); *H01L 2224/16225* (2013.01); *H01L 2924/19105* (2013.01)

(56) References Cited

U.S. PATENT DOCUMENTS

| | | |
|---|---|---|
| 2012/0326931 A1 | 12/2012 | Murayama et al. |
| 2013/0147675 A1* | 6/2013 | Kato ............... H01Q 1/38 343/788 |
| 2013/0229275 A1* | 9/2013 | Nakatani ......... B60C 23/0452 340/447 |
| 2014/0184462 A1* | 7/2014 | Yosui .................. H01Q 7/06 343/788 |
| 2015/0060555 A1 | 3/2015 | Murayama et al. |
| 2015/0188228 A1 | 7/2015 | Yosui |

FOREIGN PATENT DOCUMENTS

| | | |
|---|---|---|
| JP | 2007-102348 A | 4/2007 |
| JP | 2008-135808 A | 6/2008 |
| JP | 2012-105062 A | 5/2012 |
| JP | 5334318 B2 | 11/2013 |
| JP | 2014-93675 A | 5/2014 |
| JP | 2014-107606 A | 6/2014 |
| WO | 2005/038916 A2 | 4/2005 |
| WO | 2011/093091 A1 | 8/2011 |
| WO | 2011/108340 A1 | 9/2011 |
| WO | 2012/063526 A1 | 5/2012 |
| WO | 2014/083916 A1 | 6/2014 |
| WO | 2014/123052 A1 | 8/2014 |

OTHER PUBLICATIONS

Official Communication issued in International Patent Application No. PCT/JP2015/070018, dated Oct. 6, 2015.

* cited by examiner

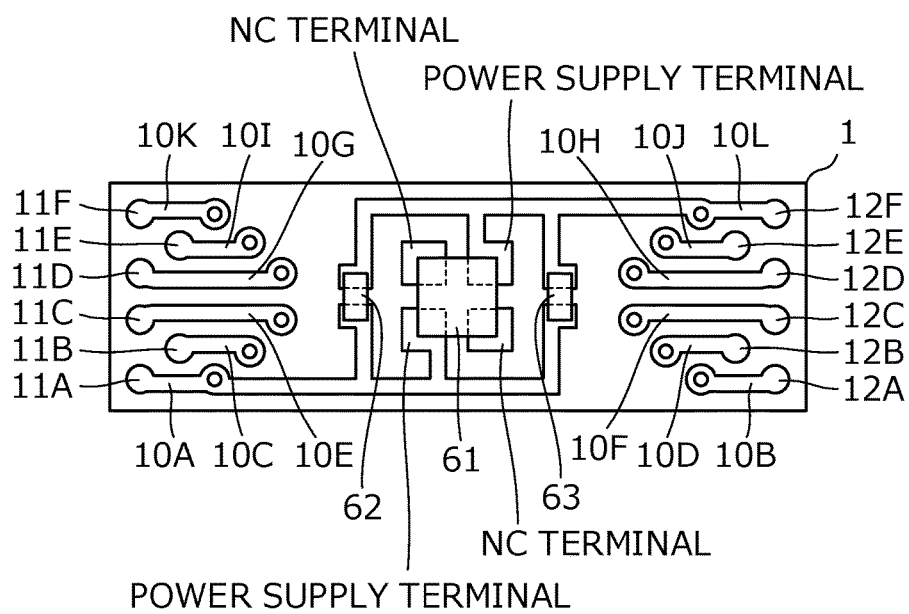

(REFERENCE EXAMPLE)

(1)

(2)

(3)

WIRELESS IC DEVICE, MOLDED RESIN ARTICLE, AND METHOD FOR MANUFACTURING COIL ANTENNA

CROSS REFERENCE TO RELATED APPLICATIONS

This application claims the benefit of priority to Japanese Patent Application 2014-172751 filed on Aug. 27, 2014, Japanese Patent Application 2014-240692 filed on Nov. 28, 2014, and PCT/JP2015/063974 filed on May 15, 2015, and is a Continuation Application of PCT/JP2015/070018 filed on Jul. 13, 2015. The entire contents of each application are hereby incorporated herein by reference.

BACKGROUND OF THE INVENTION

1. Field of the Invention

The present invention relates to a wireless IC device for use in, for example, a near field wireless communication device, such as a radio frequency identification (RFID) tag, and also relates to a molded resin article including the wireless IC device and a method for manufacturing a coil antenna.

2. Description of the Related Art

Although HF-band RFID tags are generally card-sized, small RFID tags that occupy a small area are also needed for the purpose of, for example, merchandise management. Examples of small HF-band RFID tags include RFID tags having shapes described in Japanese Unexamined Patent Application Publication No. 2007-102348 and International Publication No. 2011/108340. These small RFID tags are formed by using a sheet laminating method in which an RFIC chip is mounted on a multilayer substrate having a layered type coil antenna disposed therein.

Through the development of the above-described small RFID tags, the inventor has found that the RFID tags described in Japanese Unexamined Patent Application Publication No. 2007-102348 and International Publication No. 2011/108340 have the following problems.

In the RFID tags described in Japanese Unexamined Patent Application Publication No. 2007-102348 and International Publication No. 2011/108340, an RFIC chip is disposed on the central axis of a coil antenna or in a coil opening of the coil antenna. Therefore, the electrodes (land patterns) used to mount the RFIC chip intersect the winding axis of the coil antenna. As a result, the RFIC chip and the electrodes used to mount the RFIC chip tend to impede the formation of a magnetic field by the coil antenna. Although the formation of the magnetic field is not easily impeded when the RFIC chip is disposed at an outer side portion of the coil opening, the occupied area increases in such a case.

Since the RFIC chip is disposed on the central axis of the coil antenna or in the coil opening of the coil antenna, there is a possibility that various circuits included in the RFIC chip will malfunction due to the influence of the magnetic field. In addition, when the coil antenna transmits and receives a weak magnetic field, there is a possibility that the performance (sensitivity) of the coil antenna will be reduced due to noise generated by a digital circuit unit included in the RFIC chip.

When, in particular, the coil antenna is manufactured by a sheet laminating method, it is necessary to consider the displacements of the sheets (lamination position accuracy) and flatness of the multilayer body; therefore, there is a limit to how much the number of laminated sheets can be increased and how thick the coil pattern can be made. For this reason, the achievable inductance value is limited, and it is particularly difficult to realize a coil antenna having a low direct current resistance (DCR). It is possible to form a coil pattern having a coil winding axis that extends in a planar direction of the sheets. However, in such a case, since the number of sheets that can be laminated is limited, it is difficult to increase the coil opening area and to obtain a coil antenna having a low direct current resistance.

SUMMARY OF THE INVENTION

Accordingly, preferred embodiments of the present invention provide wireless IC devices that include a coil antenna having good electrical characteristics, in particular, a low direct current resistance, and in which interference between an RFIC chip and the coil antenna is low, and provide a molded resin article including a wireless IC device and a method for manufacturing a coil antenna.

A wireless IC device according to a preferred embodiment of the present invention includes a coil antenna; an RFIC element connected to the coil antenna; a printed wiring board including a first principal surface and a second principal surface; and a resin member adjacent to the first principal surface of the printed wiring board. The coil antenna includes a first conductor pattern provided on the printed wiring board; a first metal post that includes a first end and a second end and extends in a normal direction to the first principal surface of the printed wiring board, the first end being electrically connected to the first conductor pattern, the first metal post being embedded in the resin member; a second metal post that includes a first end and a second end and extends in the normal direction to the first principal surface of the printed wiring board, the first end being electrically connected to the first conductor pattern, the second metal post being embedded in the resin member; and a second conductor pattern provided on the resin member and including a first end that is electrically connected to the second end of the first metal post and a second end that is electrically connected to the second end of the second metal post. The coil antenna has a winding axis that extends in a direction along the first principal surface of the printed wiring board. The RFIC element is mounted so as to be adjacent to the first principal surface of the printed wiring board, disposed between the first metal post and the second metal post, and embedded in the resin member.

In the above-described structure, the main portion of the coil antenna, in particular, is defined by the metal posts. Therefore, a wireless IC device including a coil antenna for which there is substantially no limitation regarding the dimension in the direction of the coil winding axis and the coil opening area and that has good electrical characteristics, such as a low direct current resistance, is obtained.

Since the first metal post and the second metal post are at least partially embedded in the resin member and the second conductor pattern is provided on a surface of the resin member, the coil antenna is durable. In addition, the electrical connection reliability of the connecting portions between the first conductor pattern and the metal posts (first metal post and second metal post) is increased. Furthermore, the second conductor pattern is able to be easily formed simply by forming a conductor pattern on the surface of the resin member.

Preferably, the wireless IC device further includes a magnetic body (for example, a ferrite material) disposed in the coil antenna. With this structure, a wireless IC device including a coil antenna having a large inductance is obtained without increasing the size of the coil antenna.

Preferably, the first conductor pattern includes a first-principal-surface-side conductor pattern provided on the first principal surface of the printed wiring board, and a second-principal-surface-side conductor pattern provided on the second principal surface of the printed wiring board, and the RFIC element is mounted on the first principal surface of the printed wiring board, and is connected to a portion of the first-principal-surface-side conductor pattern. With this structure, the RFIC element is not exposed to the outside of the wireless IC device, so that the function of protecting the RFIC element is improved and an increase in size that occurs when the RFIC element is mounted on the exterior is avoided. In addition, the reliability of the connecting portion of the RFIC element connected to the printed wiring board is increased.

Preferably, the first-principal-surface-side conductor pattern, the first metal post, and the second metal post are provided in a plurality, the second-principal-surface-side conductor pattern is connected in series to the first-principal-surface-side conductor patterns, the first-principal-surface-side conductor patterns and the second-principal-surface-side conductor pattern extend in an X-axis direction of an orthogonal X-Y-Z coordinate system, the first metal posts are arranged in a Y-axis direction of the orthogonal X-Y-Z coordinate system and extend in a Z-axis direction of the orthogonal X-Y-Z coordinate system, the second metal posts are arranged in the Y-axis direction of the orthogonal X-Y-Z coordinate system and extend in the Z-axis direction of the orthogonal X-Y-Z coordinate system, and the first metal posts, the second conductor pattern, the second metal posts, the first-principal-surface-side conductor patterns, and the second-principal-surface-side conductor pattern define a helical coil.

With this structure, a small coil with a large number of turns can be easily obtained.

Preferably, the second-principal-surface-side conductor pattern is provided in a plurality. In addition, preferably, the number of the first-principal-surface-side conductor patterns, the number of the first metal posts, and the number of the second metal posts are each 3 or more, the number of the second-principal-surface-side conductor patterns is 2 or more, and the first metal posts and the second metal posts are arranged in the Y-axis direction and disposed in a staggered pattern when viewed in the Z-axis direction.

With this structure, the dimension in the Y-axis direction is able to be reduced even when the number of turns is large. In addition, since the end portions of the coil antenna are able to be connected (bridged) on the printed wiring board, it is not necessary to use additional connecting members, such as jumper chips, and the formation of magnetic field by the coil antenna is not easily impeded by the connecting portions (bridge portions).

Preferably, the helical coil includes a plurality of types of loops having different inner diameters, and two loops at opening surfaces of the helical coil are loops of one of the plurality of types of loops that has a largest inner diameter. With this structure, the practical area of the coil openings through which the magnetic flux extends from and returns to the helical coil are increased.

Preferably, a film thickness of the second-principal-surface-side conductor pattern is greater than a film thickness of the first-principal-surface-side conductor pattern. With this structure, the resistance of the coil antenna is easily reduced, and low-loss antenna characteristics are realized by a high Q-value coil antenna.

Preferably, the wireless IC device further includes a capacitor connected to the RFIC element. With this structure, a circuit to match the RFIC element and the coil antenna or to set the resonant frequency is easily formed, and an external circuit is able to be omitted or simplified.

Preferably, the RFIC element includes, in addition to an input-output terminal for a radio signal that is connected to the coil antenna, a digital signal terminal (for example, an $I^2C$ bus terminal or a control terminal) connected to an external digital circuit, and a terminal that is electrically connected to the digital signal terminal and connected to the external digital circuit is provided on the printed wiring board.

With this structure, a wireless IC device that operates together with a digital circuit is able to be obtained by mounting the wireless IC device on a circuit substrate of an electronic device.

A molded resin article according to a preferred embodiment of the present invention includes a wireless IC device embedded therein. The wireless IC device includes a coil antenna; an RFIC element connected to the coil antenna; a printed wiring board including a first principal surface and a second principal surface; and a resin member adjacent to the first principal surface of the printed wiring board. The coil antenna includes a first conductor pattern provided on the printed wiring board; a first metal post that includes a first end and a second end and extends in a normal direction to the first principal surface of the printed wiring board, the first end being electrically connected to the first conductor pattern, the first metal post being embedded in the resin member; a second metal post that includes a first end and a second end and extends in the normal direction to the first principal surface of the printed wiring board, the first end being electrically connected to the first conductor pattern, the second metal post being embedded in the resin member; and a second conductor pattern provided on the resin member and including a first end connected to the second end of the first metal post and a second end connected to the second end of the second metal post. The coil antenna has a winding axis that extends in a direction along the first principal surface of the printed wiring board, and the RFIC element is mounted so as to be adjacent to the first principal surface of the printed wiring board, disposed between the first metal post and the second metal post, and embedded in the resin member.

With this structure, a molded resin article in which a wireless IC device that has a high sensitivity even though the size thereof is small, or a wireless IC device that is small even though the sensitivity thereof is high is obtained.

A method for manufacturing a coil antenna according to a preferred embodiment of the present invention includes forming a first conductor pattern on at least one of a first principal surface or a second principal surface of a printed wiring board including the first principal surface and the second principal surface; placing a first metal post and a second metal post on the first principal surface of the printed wiring board and electrically connecting a first end of the first metal post and a first end of the second metal post to the first conductor pattern; covering the first principal surface of the printed wiring board with a resin member so that a height of the resin member is the same or substantially the same as a height of the first metal post and the second metal post; and forming a second conductor pattern on a surface of the resin member, the second conductor pattern including a first end that is electrically connected to a second end of the first metal post and a second end that is electrically connected to a second end of the second metal post.

With the above-described manufacturing method, a coil antenna having a large coil opening area and good electrical characteristics, such as a low direct current resistance, is easily manufactured.

According to various preferred embodiments of the present invention, wireless IC devices that include a coil antenna having good electrical characteristics, such as a low resistance, in particular, a low direct current resistance, are provided. In addition, wireless IC devices including a coil antenna having a flexibility of design with which there is substantially no limitation regarding the dimension in the direction of the coil winding axis and the coil opening area are provided.

According to various preferred embodiments of the present invention, wireless IC devices that have a high sensitivity even though the size thereof is small or that is small even though the high sensitivity thereof is high, and molded resin articles including the wireless IC device are provided.

According to methods for manufacturing the coil antenna of various preferred embodiments of the present invention, coil antennas having a large coil opening area and good electrical characteristics, such as a low direct current resistance, are easily manufactured.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4A is a bottom view of a first substrate 1 (view of a first principal surface PS1).

DETAILED DESCRIPTION OF THE PREFERRED EMBODIMENTS

Figure 1:
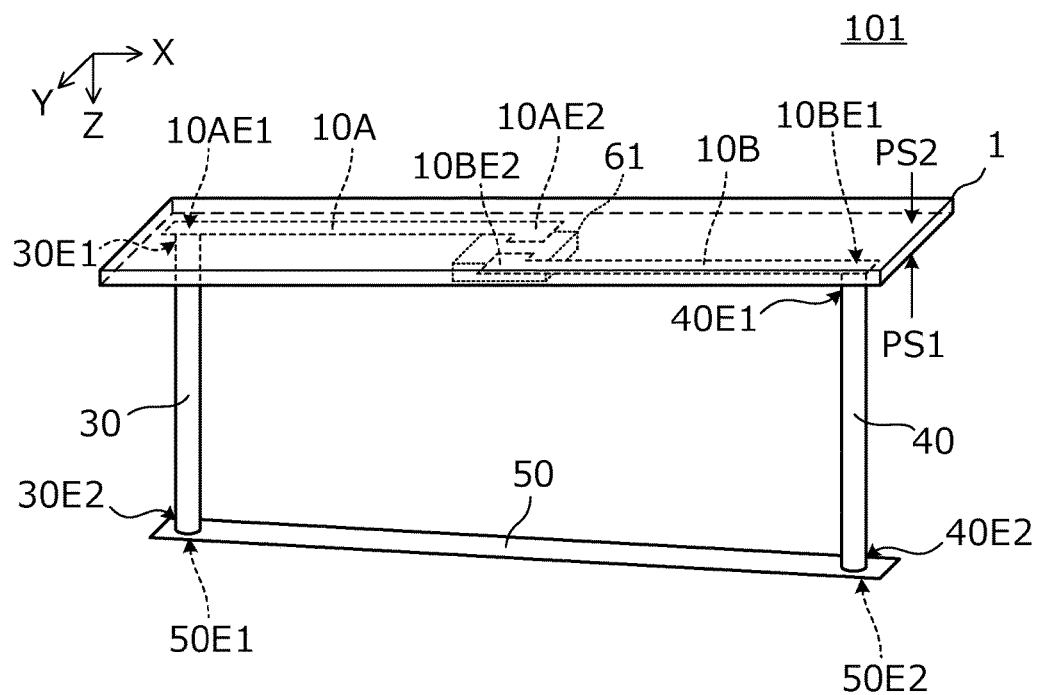
FIG. 1 is a perspective view of a wireless IC device 101 according to a first preferred embodiment of the present invention.

Preferred embodiments of the present invention will now be described with reference to the drawings by way of examples. In the drawings, the same portions are denoted by the same reference numerals. In the second and the following preferred embodiments, descriptions that are the same as those in the first preferred embodiment will be omitted, and differences will be described. In particular, descriptions of similar effects achieved by similar structures will not be repeated in each preferred embodiment.

First Preferred Embodiment

FIG. 1 is a perspective view of a wireless IC device 101 according to a first preferred embodiment of the present invention. The wireless IC device 101 includes a plate-shaped first substrate 1 including a first principal surface PS1 and a second principal surface PS2. The first substrate 1 is a plate-shaped printed wiring board having a rectangular or substantially rectangular shape in plan view, for example. The first substrate 1 is typically a double-sided through-hole substrate. First-principal-surface-side conductor patterns 10A and 10B are provided on the first principal surface PS1 of the first substrate 1. The first-principal-surface-side conductor patterns are formed by, for example, etching a Cu foil.

In the present preferred embodiment, the first-principal-surface-side conductor patterns 10A and 10B correspond to a "first conductor pattern".

The wireless IC device 101 also includes a first metal post 30 and a second metal post 40. These metal posts are pillar-shaped metal bodies. More specifically, each of the first metal post 30 and the second metal post 40 is, for example, a columnar pin made of Cu, and is formed by, for example, cutting a Cu wire having a circular or substantially circular cross section into pieces having a predetermined length. The cross-sectional shape is not limited to a circular or substantially circular shape.

The first metal post 30 extends in the normal direction to the first principal surface PS1 of the first substrate 1. A first end 30E1 of the first metal post 30 is connected (electrically connected) to a first end 10AE1 of the first-principal-surface-side conductor pattern 10A (first conductor pattern). The second metal post 40 extends in the normal direction to the first principal surface PS1 of the first substrate 1. A first end 40E1 of the second metal post 40 is connected (electrically connected) to a first end 10BE1 of the first-principal-surface-side conductor pattern 10B (first conductor pattern).

The wireless IC device 101 also includes a connection conductor 50. A first end 50E1 of the connection conductor 50 is connected (electrically connected) to a second end 30E2 of the first metal post 30, and a second end 50E2 of the connection conductor 50 is connected (electrically connected) to a second end 40E2 of the second metal post 40. The connection conductor 50 is parallel or substantially parallel to the principal surfaces of the first substrate and the first-principal-surface-side conductor patterns.

A second end 10AE2 of the first-principal-surface-side conductor pattern 10A and a second end 10BE2 of the first-principal-surface-side conductor pattern 10B are power supply ends. An RFIC element 61, in which an RFIC chip (bare chip) is packaged, is connected to (mounted on the first principal surface PS1 of the first substrate 1) the power supply ends (two power supply ends). The RFIC element 61 may be a bare-chip-shaped RFIC chip. In this case, the RFIC chip includes Au electrode terminals, and the Au electrode terminals are connected to Au plating portions of the power supply ends preferably by ultrasonic bonding, for example. The RFIC chip may instead be connected to the power supply ends (land patterns) with wires.

The first-principal-surface-side conductor patterns 10A and 10B extend in the X-axis direction of an orthogonal X-Y-Z coordinate system.

The first metal post 30 extends in the Z-axis direction. Similarly, the second metal post 40 extends in the Z-axis direction. Thus, these metal posts extend in the same direction.

The connection conductor 50 is a conductor pattern provided on a not-illustrated support member. The support member is not illustrated in FIG. 1. The support member will be described in the following preferred embodiments. The connection conductor 50 may instead be a metal member such as a hoop, a metal post, etc., that is not supported by a support member. In the present preferred embodiment, the connection conductor 50 corresponds to a "second conductor pattern".

The first-principal-surface-side conductor patterns 10A and 10B, the first metal post 30, the second metal post 40, and the connection conductor 50 define a single-turn coil antenna.

The "RFIC element" may either be an RFIC chip or an RFIC package in which an RFIC chip is mounted on and integrated with a substrate having, for example, a matching circuit. Also, an "RFID tag" is defined as an information medium which includes an RFIC element and a coil antenna connected to the RFIC element and which performs non-contact reading and writing of data stored in an internal memory by using a radio wave (electromagnetic wave) or a magnetic field. Accordingly, a wireless IC device according to a preferred embodiment of the present preferred embodiment defines and functions as an RFID tag.

The RFIC element 61 includes, for example, an HF-band high-frequency wireless IC chip for an HF-band RFID system. The above-described coil antenna and the capacitance component of the RFIC element 61 define an LC resonant circuit. The resonant frequency of the LC resonant circuit is equal or substantially equal to the communication frequency of the RFID system. The communication frequency band is, for example, 13.56 MHz band.

The wireless IC device 101 is provided on, for example, an article to be managed. When the wireless IC device 101 (that is, RFID tag) attached to the article is brought near a reader/writer device, magnetic field coupling of the coil antenna included in the wireless IC device 101 and a coil antenna included in the RFID reader/writer device occurs. Thus, RFID communication is carried out between the RFID tag and the reader/writer device.

The present preferred embodiment provides the following effects.

Since, in particular, the power supply ends are provided on the plate-shaped first substrate 1 and portions of the pattern of the coil antenna are defined by the metal posts, it is not necessary to provide a coil in a multilayer substrate, and complex wiring is not required. Therefore, a small coil structure in which the size of the coil opening is able to be freely designed can be easily realized.

Since the surface on which the RFIC element 61 is mounted is parallel or substantially parallel to the winding axis of the coil antenna (Y axis), the mounting electrodes (land patterns) of the RFIC element 61 do not easily impede the formation of a magnetic field by the coil antenna. In addition, adverse effects of the magnetic field generated by the coil antenna on the RFIC element 61 (malfunction, unstable operation, etc.) are small. In addition, adverse effects of the noise generated by a digital circuit unit included in the RFIC element 61 on the coil antenna (reduction in reception sensitivity, input of transmission signals to the reception circuit, etc.) are small.

Portions of the coil are defined by the metal posts, and the direct current resistance components of the metal posts are able to be sufficiently lower than the DCR of a sintered metal body obtained by sintering conductive paste or a conductor film, such as a thin metal body, formed by etching a conductive thin film. Therefore, a coil antenna having a high Q value and low loss is provided.

Second Preferred Embodiment

Figure 2:
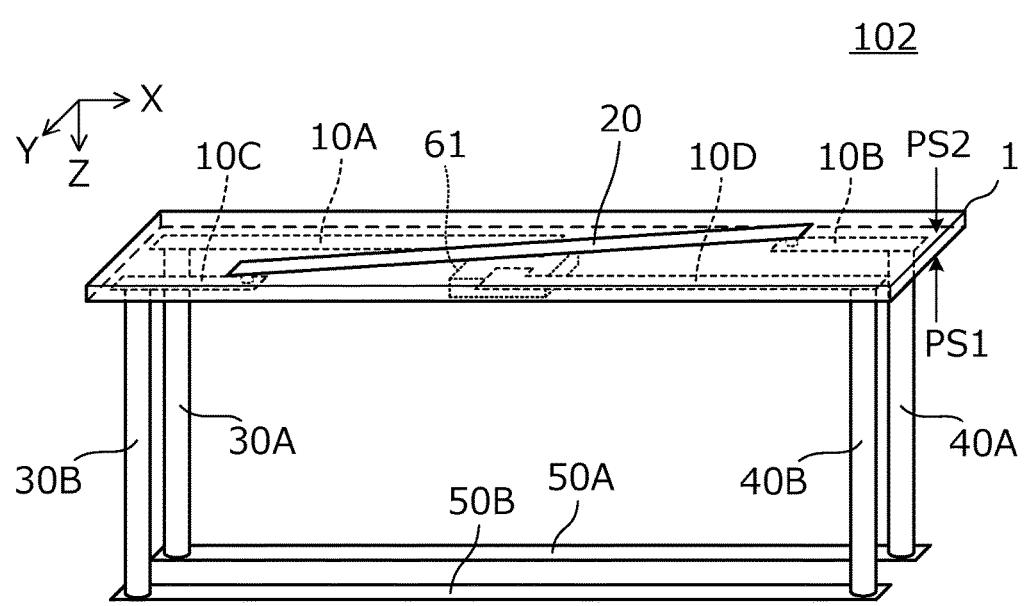
FIG. 2 is a perspective view of a wireless IC device 102 according to a second preferred embodiment of the present invention.

FIG. 2 is a perspective view of a wireless IC device 102 according to a second preferred embodiment of the present invention. Unlike the first preferred embodiment, in the present preferred embodiment, a second-principal-surface-side conductor pattern 20 is provided on a first substrate 1. The first-principal-surface-side conductor pattern, the first metal post, and the second metal post are provided in a plurality.

The wireless IC device 102 includes a first substrate 1 including a first principal surface PS1 and a second principal surface PS2. First-principal-surface-side conductor patterns 10A, 10B, 10C, and 10D are provided on the first principal surface PS1 of the first substrate 1.

In the present preferred embodiment, the first-principal-surface-side conductor patterns 10A, 10B, 10C, and 10D and the second-principal-surface-side conductor pattern 20 correspond to the "first conductor pattern".

The wireless IC device 102 further includes first metal posts 30A and 30B and second metal posts 40A and 40B. The first metal posts 30A and 30B extend in the normal direction to the first principal surface PS1 of the first substrate 1, and first ends of the first metal posts 30A and 30B are connected (electrically connected) to first ends of the first-principal-surface-side conductor patterns 10A and 10C, respectively. The second metal posts 40A and 40B extend in the normal direction to the first principal surface PS1 of the first substrate 1, and first ends of the second metal posts 40A and 40B are connected (electrically connected) to first ends of the first-principal-surface-side conductor patterns 10B and 10D, respectively.

The wireless IC device 102 further includes connection conductors 50A and 50B. First ends of the connection conductors 50A and 50B are connected (electrically connected) to second ends of the first metal posts 30A and 30B, respectively, and second ends of the connection conductors 50A and 50B are connected (electrically connected) to second ends of the second metal posts 40A and 40B, respectively. In the present preferred embodiment, the connection conductors 50A and 50B correspond to the "second conductor pattern".

A second end of the first-principal-surface-side conductor pattern 10A and a second end of the first-principal-surface-side conductor pattern 10D are power supply ends. An RFIC element 61 is mounted on the first principal surface PS1 of the first substrate 1 such that the RFIC element 61 is connected to the power supply ends (two power supply ends).

The second-principal-surface-side conductor pattern 20 is connected in series to the first-principal-surface-side conductor patterns 10B and 10C, which are the first-principal-surface-side conductor patterns other than the first-principal-surface-side conductor patterns 10A and 10D including the power supply ends. The second-principal-surface-side conductor pattern 20 is connected (electrically connected) to the first-principal-surface-side conductor patterns 10B and 10C by interlayer connection conductors (plated through holes).

The first-principal-surface-side conductor patterns 10A, 10B, 10C, and 10D and the second-principal-surface-side conductor pattern 20 extend in the X-axis direction of an orthogonal X-Y-Z coordinate system. Here, the expression "extend in the X-axis direction" is not limited to the case in which all of the first-principal-surface-side conductor patterns (10A, 10B, 10C, and 10D) and the second-principal-surface-side conductor pattern (20) are parallel or substantially parallel to each other, and includes a case in which the first-principal-surface-side conductor patterns (10A, 10B, 10C, and 10D) and the second-principal-surface-side conductor pattern (20) extend in a direction that is roughly the same as the X-axis direction, that is, in or substantially in the X-axis direction.

The first metal posts 30A and 30B are arranged in the Y-axis direction, and extend in the Z-axis direction. Similarly, the second metal posts 40A and 40B are arranged in the Y-axis direction, and extend in the Z-axis direction.

The first metal posts 30A and 30B, the second metal posts 40A and 40B, the connection conductors 50A and 50B, the first-principal-surface-side conductor patterns 10A, 10B, 10C, and 10D, and the second-principal-surface-side conductor pattern 20 define a two-turn helical coil antenna.

According to the present preferred embodiment, since the power supply ends are provided on the first principal surface PS1 of the plate-shaped first substrate 1 and the second principal surface PS2 is used to define the second-principal-surface-side conductor pattern 20 for a bridge or jumper, complex wiring is not required. Therefore, a small multiple-turn coil structure in which the size of the coil openings is able to be freely designed is easily realized.

Third Preferred Embodiment

Figure 3:
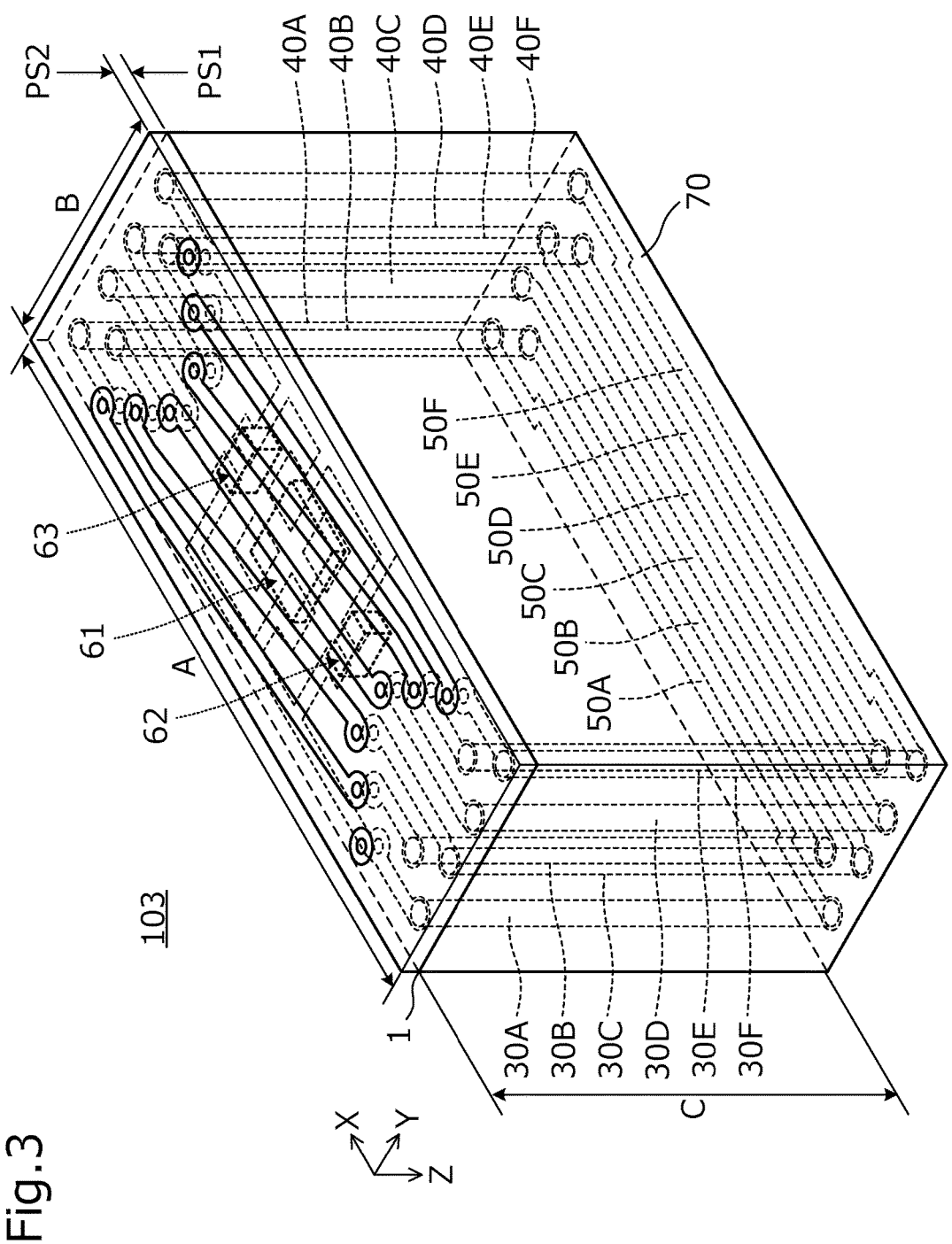
FIG. 3 is a perspective view of a wireless IC device 103 according to a third preferred embodiment of the present invention.

FIG. 3 is a perspective view of a chip-type wireless IC device 103 according to a third preferred embodiment of the present invention. Unlike the first and second preferred embodiments, in the present preferred embodiment, not only an RFIC element 61 but also chip capacitors 62 and 63 are mounted on the first substrate 1. In the present preferred embodiment, the first substrate 1 is covered with a resin member 70, and connection conductors 50A to 50F are provided on the resin member 70.

Figure 4B:
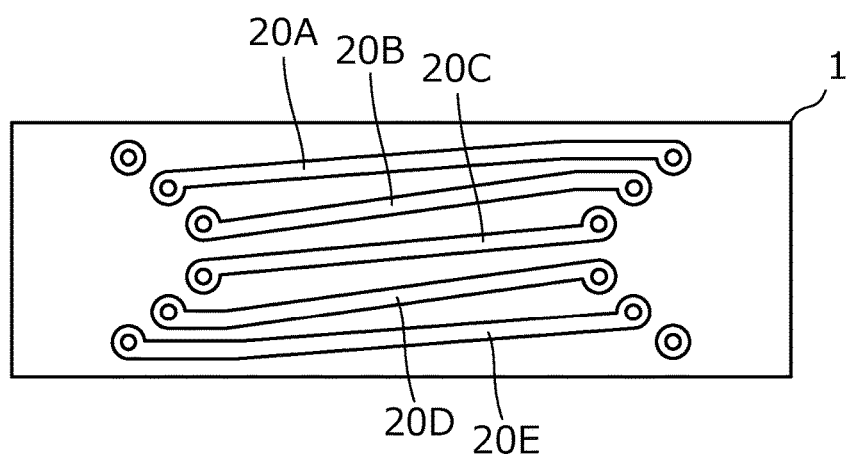
FIG. 4B is a plan view of the first substrate 1 (view of a second principal surface PS2).

FIG. 4A is a bottom view of the first substrate 1 (view of the first principal surface PS1), and FIG. 4B is a plan view of the first substrate 1 (view of the second principal surface PS2). First-principal-surface-side conductor patterns 10A to 10L are provided on the first principal surface PS1 of the first substrate 1. First ends of the first-principal-surface-side conductor patterns 10A, 10C, 10E, 10G, 10I, and 10K define and function as connecting portions 11A to 11F for first metal posts 30A to 30F. First ends of the first-principal-surface-side conductor patterns 10B, 10D, 10F, 10H, 10J, and 10L define and function as connecting portions 12A to 12F for second metal posts 40A to 40F. Second-principal-surface-side conductor patterns 20A to 20E are provided on the second principal surface PS2 of the first substrate 1.

In the present preferred embodiment, the first-principal-surface-side conductor patterns 10A to 10L and the second-principal-surface-side conductor patterns 20A to 20E correspond to the "first conductor pattern".

The first metal posts 30A to 30F extend in the normal direction to the first principal surface PS1 of the first substrate 1, and first ends of the first metal posts 30A to 30F are connected (electrically connected) to the connecting portions 11A to 11F, respectively. The second metal posts 40A to 40F extend in the normal direction to the first principal surface PS1 of the first substrate 1, and first ends of the second metal posts 40A to 40F are connected (electrically connected) to the connecting portions 12A to 12F, respectively.

The connection conductors 50A to 50F are linear conductor patterns provided on a surface of the resin member 70. The first ends of the connection conductors 50A to 50F are connected (electrically connected) to second ends of the first metal posts 30A to 30F, and second ends of the connection conductors 50A to 50F are connected (electrically connected) to second ends of the second metal posts 40A to 40F. In the present preferred embodiment, the connection conductors 50A to 50F correspond to the "second conductor pattern".

The first metal posts 30A to 30F, the second metal posts 40A to 40F, the connection conductors 50A to 50F, the first-principal-surface-side conductor patterns 10A to 10L, and the second-principal-surface-side conductor patterns 20A to 20E define a six-turn helical coil antenna.

Figure 5:
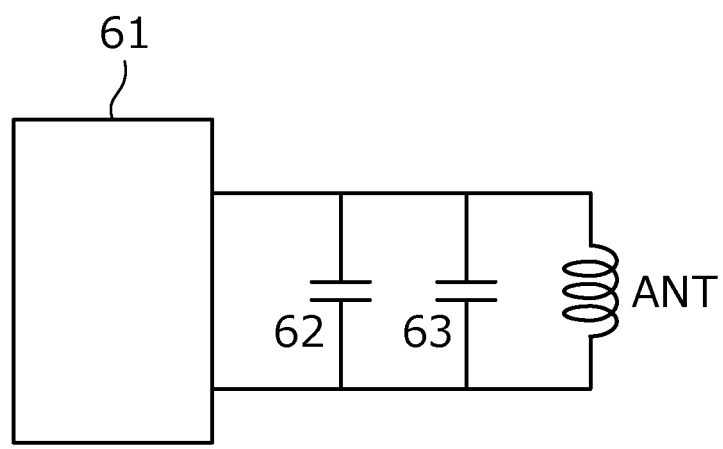
FIG. 5 is a circuit diagram of the wireless IC device 103.

FIG. 5 is a circuit diagram of the wireless IC device 103. The above-described coil antenna ANT is connected to the RFIC element 61, and the chip capacitors 62 and 63 are connected to the coil antenna ANT in parallel. The coil antenna ANT and the chip capacitors 62 and 63 define an LC resonant circuit. The capacitances of the chip capacitors 62 and 63 are selected so that the LC resonant circuit has a predetermined resonant frequency (for example, 13.56 MHz). One of the chip capacitors 62 and 63 is used for rough adjustment, and the other is used for fine adjustment. The number of capacitors to set the resonant frequency may instead be one.

The dimensions shown in FIG. 3 are, for example, as given below. The coil antenna is a thin multilayer coil antenna having a length in the coil axis direction that is smaller than the maximum length of the coil openings in a radial direction.

A: about 3 mm or more and about 12 mm or less (for example, about 8 mm)

B: about 1 mm or more and about 8 mm or less (for example, about 2.3 mm)

C: about 2 mm or more and about 15 mm or less (for example, about 5.5 mm)

Figure 6:
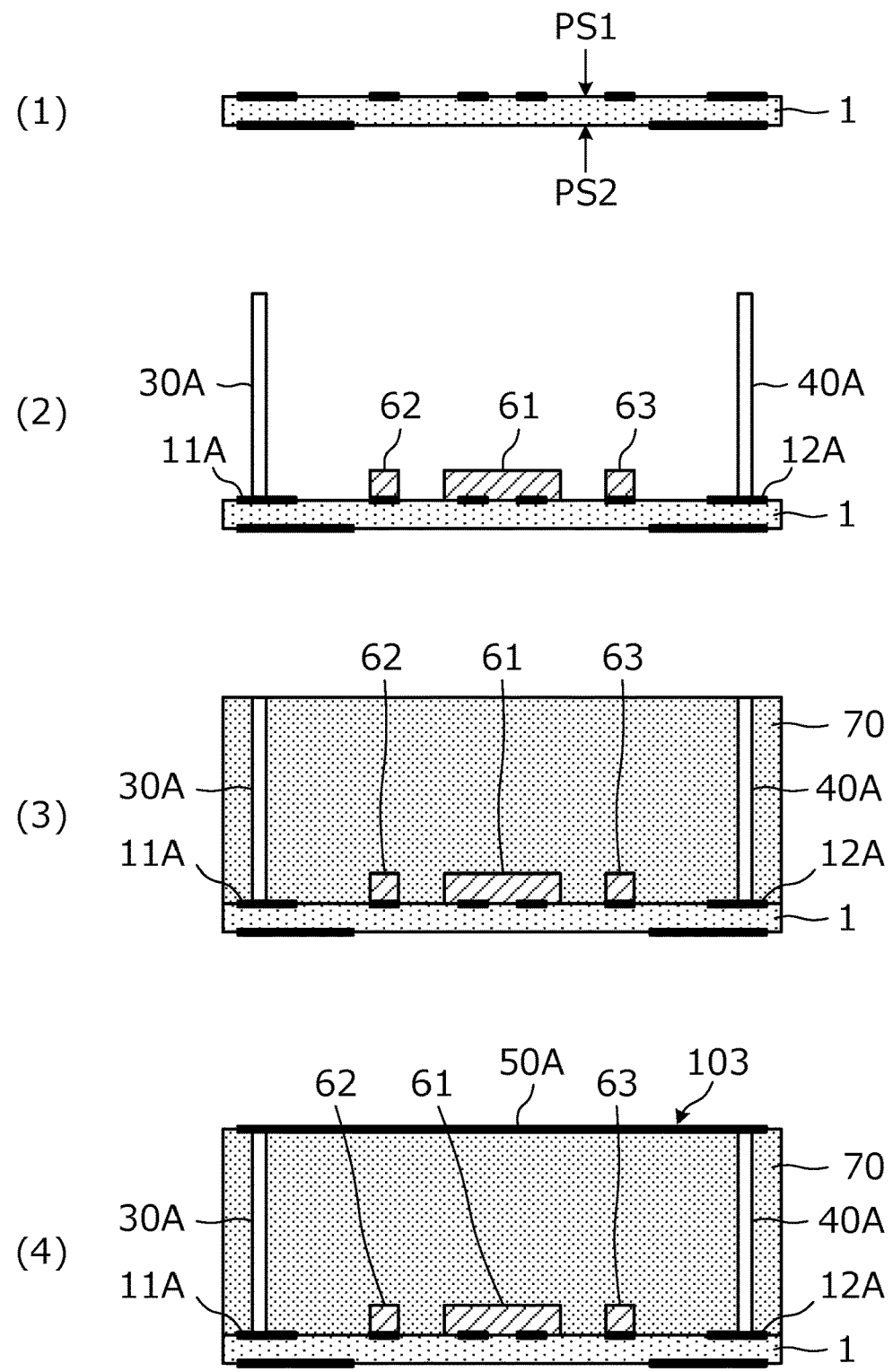
FIG. 6 is sectional view illustrating successive manufacturing steps of the wireless IC device 103.

FIG. 6 is sectional view illustrating successive manufacturing steps of a non-limiting example of a method of manufacturing the wireless IC device 103. The wireless IC device 103 is manufactured by, for example, the following steps.

First, as illustrated in part (1) of FIG. 6, the first substrate 1 is prepared. More specifically, the first-principal-surface-side conductor patterns, lands to mount the RFIC element (power supply terminals and NC terminals), lands to mount the chip capacitors, and a routing pattern to connect these lands to each other are formed on the first principal surface PS1 of the first substrate 1. In addition, the second-principal-surface-side conductor patterns are formed on the second principal surface PS2 of the first substrate 1. Plated through holes that connect the first-principal-surface-side conductor patterns to the second-principal-surface-side conductor patterns are formed so as to extend through the first substrate 1 in the thickness direction thereof (see FIGS. 4A and 4B).

The first substrate 1 is, for example, a printed wiring board formed of a glass-epoxy substrate, a resin substrate, or the like, and the first conductor patterns and lands are formed by performing patterning on a copper foil. The first substrate 1 may instead be a ceramic substrate on which a thick film pattern is formed.

The first-principal-surface-side conductor patterns and the second-principal-surface-side conductor patterns have, for example, a thickness of about 18 μm and a width of about 100 μm in cross section. After these patterns are formed, they are preferably plated with Cu or the like so that the total thickness thereof is increased to, for example, about 40 μm to about 50 μm.

Next, as illustrated in part (2) of FIG. 6, the RFIC element 61, the chip capacitors 62 and 63, and the metal posts (30A and 40A, etc.) are mounted on the first substrate 1 by using a conductive bonding material, such as solder. More specifically, when solder is used, solder paste is applied to the electrodes on the first principal surface PS1 of the first substrate 1 by printing, and the components are mounted by using a mounter. Then, the components are soldered by a reflow process. With this structure, the RFIC element 61, the chip capacitors 62 and 63, and the metal posts (30A and 40A, etc.) are electrically connected to the first substrate 1, and are structurally bonded to the first substrate 1.

The RFIC element 61 is obtained by packaging an RFIC chip for an RFID tag. The chip capacitors 62 and 63 are, for example, multilayer ceramic chip components. Each of the metal posts (30A and 40A, etc.) is a post made of Cu. These metal posts have, for example, a columnar shape with a diameter of about 0.1 mm to about 0.3 mm. Although the material of the metal posts is not limited to those containing Cu as the main component, a material containing Cu as the main component is preferably used from the viewpoint of conductivity and workability.

Next, as illustrated in part (3) of FIG. 6, the resin member 70 is formed so that the height thereof is the same as that of the metal posts (30A and 40A, etc.). More specifically, epoxy resin or the like is applied to a predetermined height (height greater than or equal to that of the metal posts (30A and 40A, etc.)), and then the surface of the resin member 70 is ground in a planar manner so that head portions of the metal posts (30A and 40A, etc.) are exposed.

The resin member 70 may be formed either by applying liquid resin or by stacking a semi-hardened resin sheet.

Next, as illustrated in part (4) of FIG. 6, the connection conductors (50A, etc.) are formed on the surface of the resin member 70. More specifically, a conductor film, such as a Cu film, is formed on the surface of the resin member 70 at which the head portions of the metal posts (30A and 40A, etc.) are exposed, by plating or the like. Then, patterning is performed on the conductor film by applying photoresist and performing etching. The connection conductors (50A, etc.) may instead be formed by screen printing by using conductive paste.

After that, a plating film made of Cu or the like is preferably formed on the second-principal-surface-side conductor patterns and the connection conductors (50A, etc.). In the case where a Cu plating film is formed, an Au plating film may be additionally formed on the surface of the plating film made of Cu or the like. Accordingly, the second-principal-surface-side conductor patterns and the connection conductors (50A, etc.) are increased in thickness, and the DCR thereof is reduced, so that the conductor loss is reduced. Thus, the DCR of the second-principal-surface-side conductor patterns and the connection conductors (50A, etc.) is reduced to a value that is about as small as the DCR of the metal posts (30A and 40A, etc.). More specifically, since the second-principal-surface-side conductor patterns and the connection conductors are exposed at the outer surface of a body in this stage, the thickness of the second-principal-surface-side conductor patterns and the connection conductors is able to be selectively increased (the thickness of the second-principal-surface-side conductor patterns can be increased relative to the thickness of the first-principal-surface-side conductor pattern) by immersing the body in a plating solution.

After that, anti-oxidation protective resin films (solder resist films or the like) are formed as necessary on the outer surface of the first substrate 1 (second principal surface PS2) and the surface of the resin member 70 on which the connection conductors (50A, etc.) are formed.

The above-described steps are performed on a mother substrate. Lastly, the mother substrate is divided to separate individual wireless IC devices (pieces) from each other.

Figure 7:
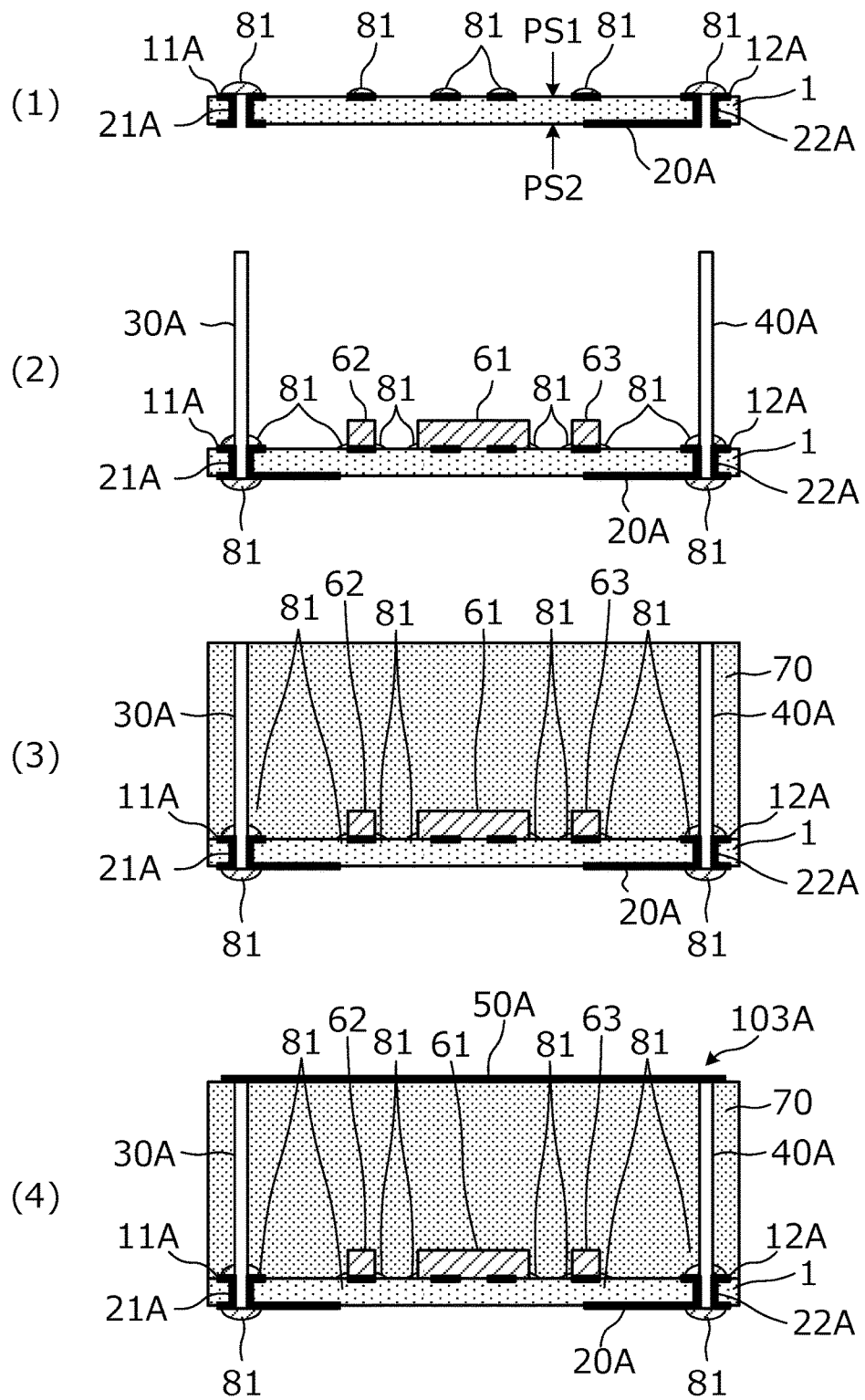
FIG. 7 is sectional view illustrating successive manufacturing steps of the wireless IC device 103 that are different from the manufacturing steps illustrated in FIG. 6.

FIG. 7 is sectional view illustrating successive manufacturing steps of the wireless IC device 103 that are different from the manufacturing steps illustrated in FIG. 6. The wireless IC device 103 may be manufactured by, for example, the following steps.

First, as illustrated in part (1) of FIG. 7, the first substrate 1 is prepared. More specifically, the first-principal-surface-side conductor patterns (the first-principal-surface-side conductor patterns 10A and 10L illustrated in FIG. 4A), the connecting portions (11A, etc.) (first ends of first conductor patterns), connecting portions (12A, etc.) (second ends of first conductor patterns), lands to mount the RFIC element (power supply terminals and NC terminals), lands to mount the chip capacitors, and a routing pattern to connect these lands to each other are formed on the first principal surface PS1 of the first substrate 1. In addition, the second-principal-surface-side conductor patterns (20A, etc.) are formed on the second principal surface PS2 of the first substrate 1. In this manufacturing step, it is not necessary to form the first-principal-surface-side conductor patterns 10B to 10K illustrated in FIG. 4A on the first principal surface PS1 of the first substrate 1.

In addition, a plated through hole (21A, etc.) to connect the connecting portions (11A, etc.) (first ends of first conductor patterns) to the second-principal-surface-side conductor patterns are formed so as to extend through the first substrate 1 in the thickness direction thereof. Also, a plated through hole (22A, etc.) and other plated through holes to connect the connecting portions (12A, etc.) (second ends of first conductor patterns) to the second-principal-surface-side conductor patterns (20A, etc.) are formed so as to extend through the first substrate 1 in the thickness direction thereof. The plated through holes (21A and 22A, etc.) are formed so that the inner diameter thereof is the same or substantially the same as the outer diameter of the first metal posts (30A, etc.) and the second metal posts (40A, etc.).

A conductive bonding material 81, such as solder paste, is applied to lands to mount the RFIC element 61 and lands to mount the first metal posts (30A, etc.) and the second metal posts (40A, etc.) on the first principal surface PS1 of the first substrate 1 by screen printing. As described in detail below, it is not essential to form the conductive bonding material 81 on the connecting portions (11A, etc.) (first ends of first conductor patterns), the connecting portions (12A, etc.) (second ends of first conductor patterns), and the plated through holes (21A and 22A, etc.).

Next, as illustrated in part (2) of FIG. 7, the RFIC element 61 and the chip capacitors 62 and 63 are mounted on the first substrate 1 by using the conductive bonding material 81 such as solder. The first metal posts (30A, etc.) and the second metal posts (40A, etc.) are also mounted. Thus, the second-principal-surface-side conductor patterns are directly connected to the first metal posts, respectively, without the first-principal-surface-side conductor patterns 10C, 10E, 10G, 10I, and 10K illustrated in FIG. 4A interposed therebetween. The second-principal-surface-side conductor patterns are also directly connected to the second metal posts without the first-principal-surface-side conductor patterns 10B, 10D, 10F, 10H, and 10J interposed therebetween.

The first ends of the first metal posts (30A, etc.) are inserted into the plated through holes (21A, etc.) and are mounted by using the conductive bonding material 81 such as solder. The first ends of the second metal posts (40A, etc.) are inserted into the plated through holes (22A, etc.) and are mounted by using the conductive bonding material 81 such as solder. When the metal posts (first metal posts (30A, etc.) and second metal posts (40A, etc.)) are able to be fixed by inserting the first ends thereof into the plated through holes (21A and 22A, etc.), it is not necessary to mount the metal posts by using the conductive bonding material 81 such as solder.

Next, as illustrated in part (3) of FIG. 7, the resin member 70 is formed so that the height thereof is the same or substantially the same as that of the metal posts. More specifically, epoxy resin or the like is applied to a predetermined height (height greater than or equal to that of the metal posts), and then the surface of the resin member 70 is ground (or cut) in a planar manner so that head portions of the metal posts are exposed. Alternatively, epoxy resin or the like may be applied to a predetermined height (height less than or equal to that of the metal posts), and then the resin member 70 may be ground (or cut) in a planar manner together with the metal posts so that head portions of the metal posts are exposed at the surface of the resin member 70.

Next, as illustrated in part (4) of FIG. 7, the connection conductors (50A, etc.) are formed on the surface of the resin member 70.

After that, anti-oxidation protective resin films (solder resist films or the like) are formed as necessary on the outer surface of the first substrate 1 (second principal surface PS2) and the surface of the resin member 70 on which the connection conductors (50A, etc.) are formed.

Figure 8A:
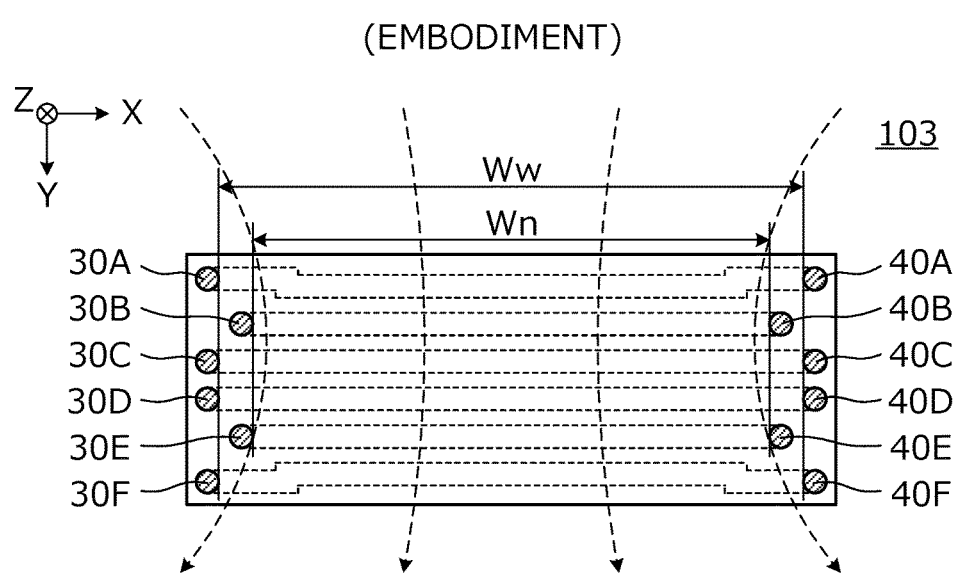
FIG. 8A is a cross-sectional view of the wireless IC device 103 at the middle height of metal posts 30A to 30F and 40A to 40F.
Figure 8B:
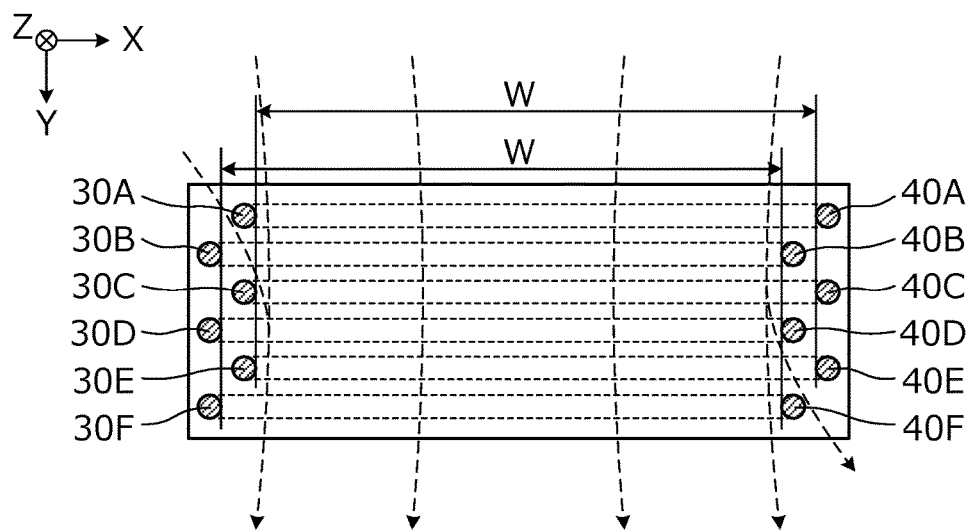
FIG. 8B is a cross-sectional view of a wireless IC device according to a reference example at the middle height of metal posts 30A to 30F and 40A to 40F.

FIG. 8A is a cross-sectional view of the wireless IC device 103 at the middle height of the metal posts 30A to 30F and 40A to 40F. FIG. 8B is a cross-sectional view of a wireless IC device according to a reference example at the middle height of metal posts 30A to 30F and 40A to 40F. The difference between the wireless IC device 103 according to the present preferred embodiment and the wireless IC device according to the reference example is the arrangement of the metal posts 30A to 30F and 40A to 40F.

In each of the wireless IC device 103 according to the present preferred embodiment and the wireless IC device according to the reference example, the first metal posts 30A to 30F and the second metal posts 40A to 40F are arranged in the Y-axis direction and are disposed in a staggered pattern when viewed in the Z-axis direction. In the wireless IC device 103 according to the present preferred embodiment, the helical coil includes two types of loops having different inner diameters. As illustrated in FIG. 8A, the loop including the first metal post 30A and the second metal post 40A, the loop including the first metal post 30C and the second metal post 40C, the loop including the first metal post 30D and the second metal post 40D, and the loop including the first metal post 30F and the second metal post 40F each have an opening width of Ww. In addition, the loop including the first metal post 30B and the second metal post 40B and the loop including the first metal post 30E and the second metal post 40E each have an opening width of Wn. Here, Wn<Ww is satisfied. In contrast, in the wireless IC device according to the reference example, as illustrated in FIG. 8B, all loops have an opening width of W.

In the wireless IC device 103 according to the present preferred embodiment, the two loops at the opening surfaces of the helical coil antenna (the loop including the first metal post 30A and the second metal post 40A and the loop including the first metal post 30F and the second metal post 40F) belong to one of the two types of loops that has a lager inner diameter.

More specifically, assume that "first loop" is the loop including the first metal post 30A, which is one of the first metal posts 30A to 30F that is at a first end in the Y-axis direction, and the second metal post 40A, which is one of the second metal posts 40A to 40F that is at the first end in the Y-axis direction, and "second loop" is the loop including the first metal post 30F, which is one of the first metal posts 30A to 30F that is at a second end in the Y-axis direction, and the second metal post 40F, which is one of the second metal posts 40A to 40F that is at the second end in the Y-axis direction. In this case, the inner diameter of the first loop and the second loop is the inner diameter of one of the two types of loops that has a larger inner diameter.

In FIGS. 8A and 8B, the dashed lines conceptually indicate the magnetic flux that passes through the helical coil antenna. In the reference example, the practical inner diameter of the two loops at the opening surfaces of the helical coil antenna is smaller than the opening width W of the loops. In addition, the magnetic flux easily leaks from the gaps between the adjacent metal posts. According to the present preferred embodiment, the inner diameter of the two loops at the opening surfaces of the helical coil antenna is the inner diameter of one of the two types of loops that has a lager inner diameter. Therefore, the practical coil openings of the coil antenna through which the magnetic flux passes are larger than those in the reference example. In addition, the magnetic flux does not easily leak from the gaps between the adjacent metal posts. Therefore, magnetic field coupling between the coil antenna and an antenna that communicates with the coil antenna is provided in relatively various positions therebetween. Thus, when a helical coil antenna having three or more turns is provided, the metal posts are preferably arranged so that the loop area at both ends in the coil axis direction is large.

The above-described helical coil may include three or more types of loops with different inner diameters. In such a case, the inner diameter of the two loops at the opening surfaces of the coil antenna may be the inner diameter of one of the three or more types of loops that has the largest inner diameter.

The present preferred embodiment provides the following effects.

In the chip-type wireless IC device 103, the RFIC element 61 is disposed in the coil antenna. Therefore, the function of protecting the RFIC element 61 is improved, and an increase in size that occurs when the RFIC element 61 is mounted on the exterior is avoided.

In this chip-type wireless IC device 103, the surface mount chip components, such as the RFIC element 61 and the chip capacitors 62 and 63, and the metal posts 30A to 30F and 40A to 40F are protected by the resin member 70. Therefore, the entirety of the wireless IC device is durable.

In particular, when the wireless IC device is embedded in a molded resin article, solder connecting portions of the surface mount chip components are protected from high-temperature resin (for example, resin at a temperature of about 300° C. or more) that flows during injection molding. More specifically, the RFIC element 61 is disposed in the area surrounded by the metal posts 30A to 30F and 40A to 40F, the first-principal-surface-side conductor patterns 10A to 10L, the second-principal-surface-side conductor patterns 20A to 20E, etc., which define the coil antenna, and is surrounded by the resin member 70 and the first substrate 1. With this structure, a large thermal load is not easily applied to the RFIC element 61 and the connecting portions between the RFIC element 61 and the power supply terminals (first conductor patterns). Accordingly, even when the wireless IC device 103 is embedded in a molded resin object (toy, container, etc.), sufficient operational reliability of the RFIC element 61 is ensured, and the reliability of the connecting portions between the RFIC element 61 and the power supply terminals is increased. Thus, a highly heat-resistant wireless IC device that is able to be disposed in a molded resin article, in other words, that is resistant to high temperature during injection molding, is provided. Even when the solder bonding portions are melted once at a high temperature, since the resin member 70 and the first substrate 1 are bonded together by the adhesion between the resins, the mounting components and the metal posts are not detached or deformed. Therefore, the bonding state of the solder bonding portions returns to the normal state after the solder bonding portions are cooled. As a result, the inductance value of the coil antenna is maintained.

Since the main portions of the second-principal-surface-side conductor patterns 20A to 20E included in the coil antenna are provided on the second principal surface PS2 of the first substrate 1, the practical opening diameter of the coil antenna is large. Therefore, a coil antenna having the same or substantially the same size as the chip-type wireless IC device 103 is provided. Accordingly, a large communication distance is ensured even when the chip size is small, and communication with another antenna is achieved in relatively various positions.

Since the connection conductors 50A to 50F of the wireless IC device 103 are provided on the surface of the resin member 70 by patterning, the connection conductors 50A to 50F is easily connected to the metal posts 30A to 30F and 40A to 40F.

Since the first metal posts and the second metal posts are disposed in a staggered pattern along the arrangement direction at least in end portions in the coil axis direction, the size is able to be made small even when the number of turns is large (in other words, even when the number of metal posts is increased).

Fourth Preferred Embodiment

Figure 9:
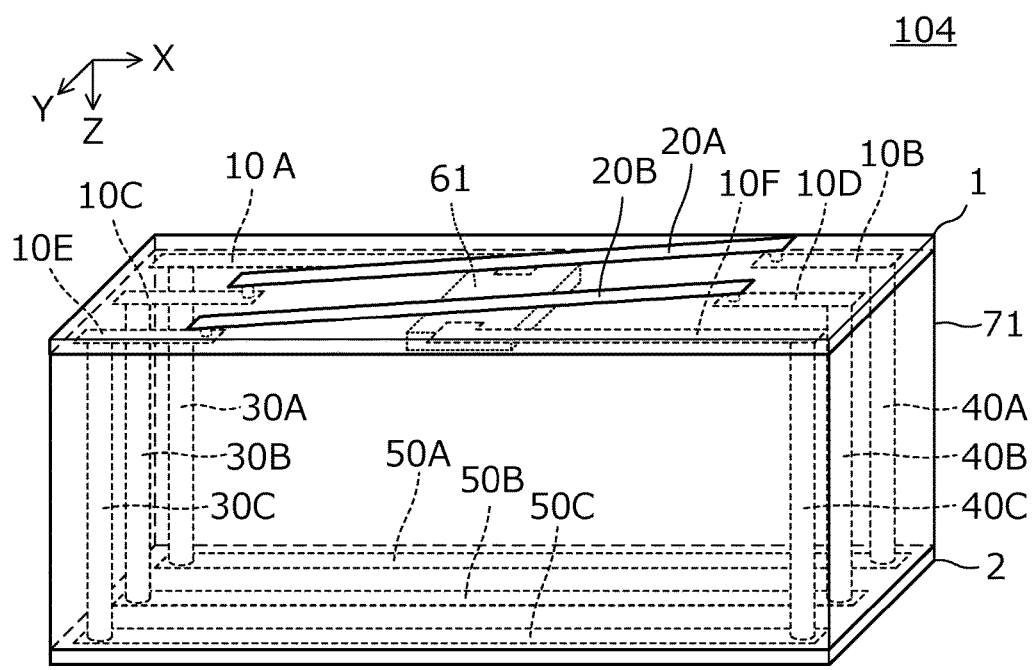
FIG. 9 is a perspective view of a wireless IC device 104 according to a fourth preferred embodiment of the present invention.

FIG. 9 is a perspective view of a wireless IC device 104 according to a fourth preferred embodiment of the present invention. In the present preferred embodiment, unlike the first to third preferred embodiments, a second substrate 2 is provided. Connection conductors 50A, 50B, and 50C are provided on the second substrate 2. Other basic structures of the present preferred embodiment are the same as those in the third preferred embodiment.

In the present preferred embodiment, first-principal-surface-side conductor patterns 10A, 10B, 10C, 10D, 10E, and 10F and second-principal-surface-side conductor patterns 20A and 20B illustrated in FIG. 9 correspond to the "first conductor pattern". In addition, in the present preferred embodiment, the connection conductors 50A, 50B, and 50C illustrated in FIG. 9 correspond to the "second conductor pattern".

Figure 10:
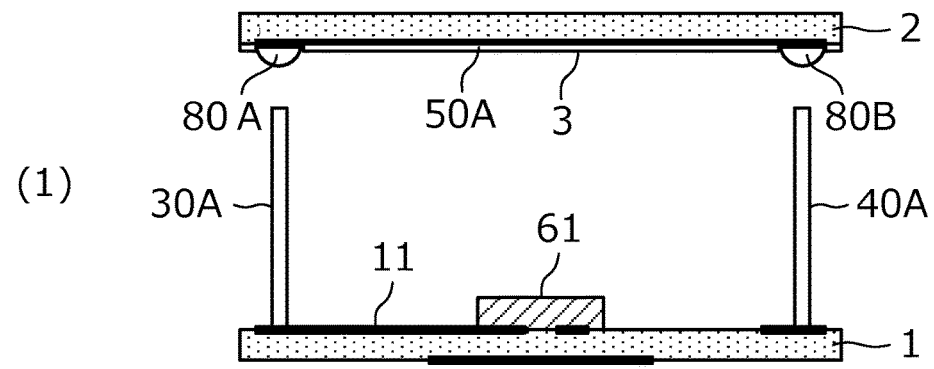
FIG. 10 is sectional view illustrating successive manufacturing steps of the wireless IC device 104.
Figure 10:
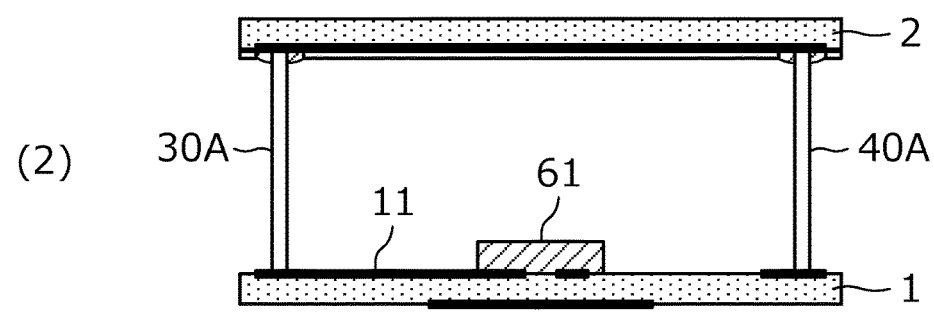
Figure 10:
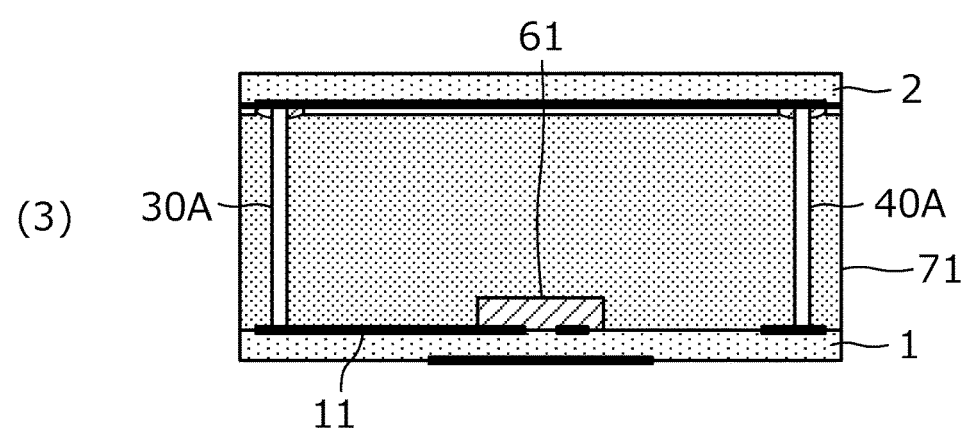

FIG. 10 is sectional view illustrating successive manufacturing steps of the wireless IC device 104. The wireless IC device 104 is manufactured by, for example, the following steps.

First, as illustrated in part (1) of FIG. 10, a first substrate 1 is prepared, and an RFIC element 61 and metal posts (30A and 40A, etc.) are mounted on the first substrate 1.

In addition, the connection conductors (50A, etc.) are formed on the second substrate 2, then a solder resist film 3 is formed, and conductive bonding materials 80A and 80B, such as solder, are formed on both ends of the connection conductors (50A, etc.).

Next, as illustrated in part (2) of FIG. 10, the connection conductors (50A, etc.) on the second substrate 2 are connected (electrically connected) to the ends of the metal posts (30A and 40A, etc.). Thus, the second substrate 2 is attached to the metal posts (30A and 40A, etc.).

Next, as illustrated in part (3) of FIG. 10, the space between the first substrate 1 and the second substrate 2 is filled with a resin member 71. Here, a resin material containing magnetic powder, such as ferrite powder, is injected into the space between the first substrate 1 and the second substrate 2, and is hardened.

The present preferred embodiment provides the following effects.

Since the connection conductors 50A to 50C may be formed on the substrate in advance by patterning, the connection conductors 50A to 50C is able to be easily formed.

The connection conductors are able to be easily connected to the first metal posts 30A to 30C and the second metal posts 40A to 40C.

Since the connection conductors 50A to 50C are provided on a rigid substrate (second substrate 2), the wireless IC device is durable. In addition, the connecting portions between the first-principal-surface-side conductor patterns and the metal posts (first metal posts and second metal posts) have high electrical connection reliability.

Since the resin member is magnetic, the overall size required for the coil antenna to have a predetermined inductance is able to be reduced.

Since the first-principal-surface-side conductor patterns 10A to 10F, the second-principal-surface-side conductor patterns 20A and 20B, and the connection conductors 50A, 50B, and 50C are not embedded in the magnetic body, the magnetic field expands the surface of the first substrate 1 and the surface of the second substrate 2, and communication distances in these directions are increased. Side portions of the metal posts 30A to 30C and 40A to 40C may be exposed at surfaces of the resin member 71. In such a case, the magnetic field also expands the surfaces of the resin member 71 at which the metal posts 30A to 30C and 40A to 40C are exposed, and communications in these directions are able to be achieved.

In the present preferred embodiment, the connection conductors 50A to 50C are preferably provided on one principal surface of the second substrate 2 (upper surface of the second substrate 2 in FIG. 9). However, the structure is not limited to this. The connection conductors 50A to 50C may instead be provided on the other principal surface of the second substrate 2 (lower surface of the second substrate 2 in FIG. 9). In this case, the first ends of the connection conductors 50A to 50C are connected (electrically connected) to the second ends of the first metal posts 30A to 30C by, for example, interlayer connection conductors (through hole conductors), and the second ends of the connection conductors 50A to 50C are connected (electrically connected) to the second ends of the second metal posts 40A to 40C by, for example, interlayer connection conductors (through hole conductors). Alternatively, by the manufacturing method illustrated in FIG. 7, the first ends of the connection conductors 50A to 50C may be directly connected to the second ends of the first metal posts 30A to 30C, and the second ends of the connection conductors 50A to 50C may be directly connected to the second ends of the second metal posts 40A to 40C.

Fifth Preferred Embodiment

Figure 11:
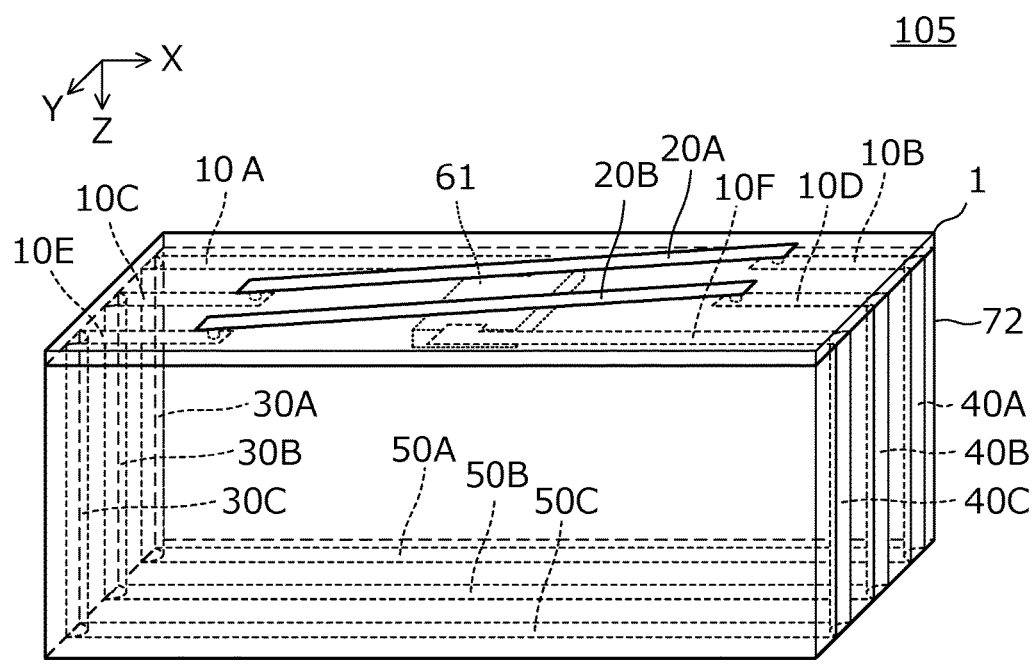
FIG. 11 is a perspective view of a wireless IC device 105 according to a fifth preferred embodiment of the present invention.

FIG. 11 is a perspective view of a wireless IC device 105 according to a fifth preferred embodiment of the present invention. Unlike the first to fourth preferred embodiments, first metal posts and second metal posts according to the present preferred embodiment are exposed at outer surfaces of the wireless IC device 105. The wireless IC device 105 according to the present preferred embodiment does not include a second substrate. Other basic structures are the same as those described in the fourth preferred embodiment.

As illustrated in FIG. 11, first metal posts 30A to 30C and second metal posts 40A to 40C are semicircular columnar conductors that extend in the Z-axis direction of an orthogonal X-Y-Z coordinate system. As described in detail below, the first metal posts 30A to 30C and the second metal posts 40A to 40C are formed preferably by cutting columnar metal posts in the height direction.

Figure 12:
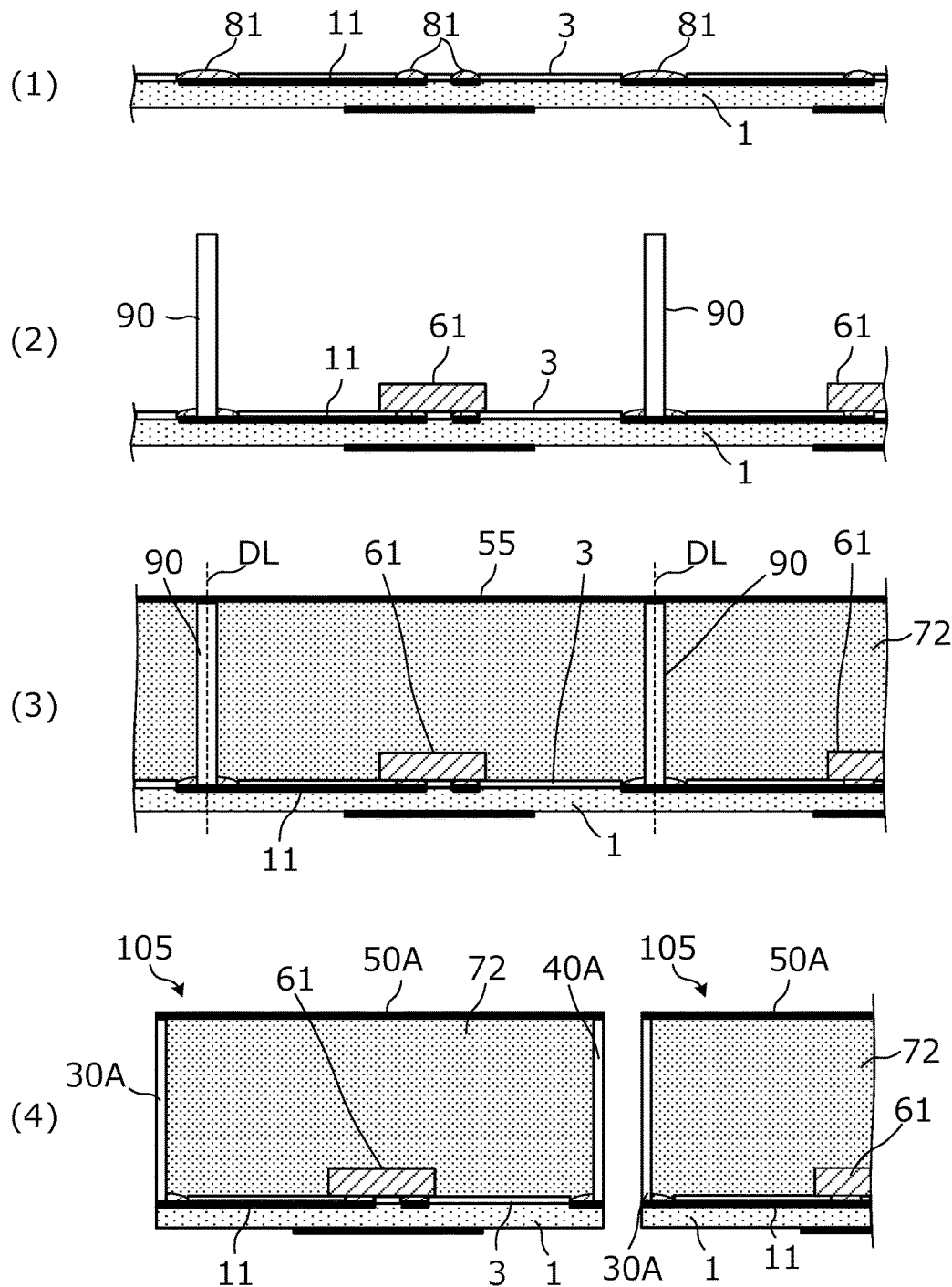
FIG. 12 is sectional view illustrating successive manufacturing steps of the wireless IC device 105.

The first metal posts 30A to 30C are structured such that side surfaces thereof, which are the cut surfaces of the semicircular columnar shape, are parallel or substantially parallel to one side surface of the wireless IC device 105 (left side surface in FIG. 11) and exposed at the one side surface of the wireless IC device 105. First ends of the first metal posts 30A to 30C are connected (electrically connected) to first-principal-surface-side conductor patterns 10A, 10C, and 10E, and second ends of the first metal posts 30A to 30C are connected (electrically connected) to connection conductors 50A to 50C. The second metal posts 40A to 40C are structured such that side surfaces thereof, which are the cut surfaces of the semicircular columnar shape, are parallel or substantially parallel to the other side surface of the wireless IC device 105 (right side surface in FIG. 11) and exposed at the other side surface of the wireless IC device 105. First ends of the second metal posts 40A to 40C are connected (electrically connected) to first-principal-surface-side conductors 10B, 10D, and 10F, and second ends of the second metal posts 40A to 40C are connected (electrically connected) to the connection conductors 50A to 50C. As illustrated in FIGS. 11 and 12, in the present preferred embodiment, the first metal posts 30A to 30C and the second metal posts 40A to 40C are exposed at surfaces of a resin member 72 of the wireless IC device 105.

In the present preferred embodiment, the first-principal-surface-side conductor patterns 10A to 10F, second-principal-surface-side conductor patterns 20A and 20B, the first metal posts 30A to 30B, the second metal posts 40A to 40B, and the connection conductors 50A to 50C define a coil antenna. The second-principal-surface-side conductor patterns 20A and 20B, the first metal posts 30A to 30C, the second metal posts 40A to 40C, and the connection conductors 50A to 50C included in the coil antenna are exposed at the outer surface of the wireless IC device 105. Thus, the wireless IC device 105 according to the present preferred embodiment is structured such that most of the conductors that constitute the coil antenna are exposed at the outer surface of the wireless IC device 105.

FIG. 12 is sectional view illustrating successive manufacturing steps of the wireless IC device 105. The wireless IC device 105 is manufactured by, for example, the following steps.

First, as illustrated in part (1) of FIG. 12, the first substrate 1 is prepared, and a solder resist film 3 is formed. In addition, a conductive bonding material 81, such as solder paste, is applied to, for example, lands to mount RFIC element 61 and lands to mount metal posts 90.

Next, as illustrated in part (2) of FIG. 12, the RFIC element 61, the metal posts 90, etc., are mounted on the first substrate 1.

Next, as illustrated in part (3) of FIG. 12, a resin member 72 is formed so that the height thereof is the same or substantially the same as that of the metal posts 90, and a connection conductor 55 is formed on the surface of the resin member 72.

More specifically, a resin material containing magnetic powder, such as ferrite powder or permalloy powder, is applied to a predetermined height (height greater than or equal to that of the metal posts 90), and then the surface of the resin member 72 is ground in a planar manner so that head portions of the metal posts 90 are exposed. The resin member 72 may be formed either by applying liquid resin or by stacking a semi-hardened resin sheet.

The above-described steps are performed on a mother substrate. Lastly, as illustrated in part (4) of FIG. 12, the mother substrate is divided to separate individual wireless IC devices (pieces) from each other. More specifically, the mother substrate is cut along dividing lines DL illustrated in part (3) of FIG. 12. When the mother substrate is cut along the dividing lines DL, the metal posts 90 are divided into the first metal posts (30A, etc.) and the second metal posts (40A, etc.).

According to the present preferred embodiment, since the first metal posts 30A to 30C and the second metal posts 40A to 40C are exposed at the outer surface of the resin member 72 of the wireless IC device 105, the magnetic field radiates efficiently. In addition, since a majority of the coil antenna of the wireless IC device 105 is exposed at the outer surface of the wireless IC device 105, the magnetic field radiates more efficiently.

The wireless IC device 105 may be subjected to barrel finishing or electroless nickel gold plating as necessary. When these processes are performed, plating films are formed on the cut surfaces of the metal posts 90, the connection conductors (50A, etc.), and the second-principal-surface-side conductor patterns (20A, etc.), so that the film thickness thereof is increased and the DCR thereof is reduced. Therefore, the conductor loss is reduced. In addition, the environment resistance of the wireless IC device 105 is increased.

Sixth Preferred Embodiment

Figure 13:
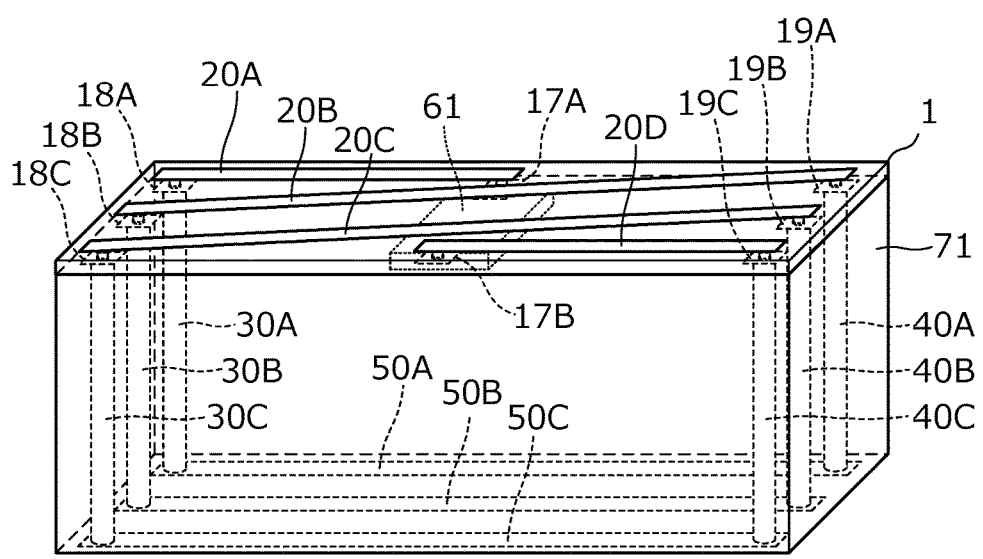
FIG. 13 is a perspective view of a wireless IC device 106 according to a sixth preferred embodiment of the present invention.

FIG. 13 is a perspective view of a wireless IC device 106 according to a sixth preferred embodiment of the present invention. Unlike the first to fifth preferred embodiments, the wireless IC device 106 according to the present preferred embodiment does not include first-principal-surface-side conductor patterns that extend in the X-axis direction of an orthogonal X-Y-Z coordinate system. In addition, the wireless IC device 106 according to the present preferred embodiment does not include a second substrate. Other structures of the present preferred embodiment are the same as those in the fourth preferred embodiment.

Connection electrodes 17A, 17B, 18A, 18B, 18C, 19A, 19B, and 19C are provided on a first principal surface of a first substrate 1. The connection electrodes 17A and 17B are lands to mount an RFIC element (power supply terminals). The connection electrodes 18A, 18B, and 18C are lands to mount first metal posts 30A to 30C. The connection electrodes 19A, 19B, and 19C are lands to mount second metal posts 40A to 40C. Second-principal-surface-side conductor patterns 20A, 20B, 20C, and 20D are provided on a second principal surface of the first substrate 1.

In the present preferred embodiment, the second-principal-surface-side conductor patterns 20A, 20B, 20V, and 20D correspond to the "first conductor pattern". In the present preferred embodiment, connection conductors 50A, 50B, and 50C illustrated in FIG. 13 correspond to the "second conductor pattern".

The connection electrode 17A is connected (electrically connected) to a second end of the second-principal-surface-side conductor pattern 20A by an interlayer connection conductor (through hole conductor) provided in the first substrate 1. The connection electrode 17B is connected (electrically connected) to a first end of the second-principal-surface-side conductor pattern 20D by an interlayer connection conductor (through hole conductor) provided in the first substrate 1.

A first end of the second-principal-surface-side conductor pattern 20A is connected (electrically connected) to the connection electrode 18A by an interlayer connection conductor (through hole conductor). A first end of the second-principal-surface-side conductor pattern 20B is connected (electrically connected) to the connection electrode 18B by an interlayer connection conductor (through hole conductor), and a second end of the second-principal-surface-side conductor pattern 20B is connected (electrically connected) to the connection electrode 19A by an interlayer connection conductor (through hole conductor). A first end of the second-principal-surface-side conductor pattern 20C is connected (electrically connected) to the connection electrode 18C by an interlayer connection conductor (through hole conductor), and a second end of the second-principal-surface-side conductor pattern 20C connected (electrically connected) to the connection electrode 19B by an interlayer connection conductor (through hole conductor). A second end of the second-principal-surface-side conductor pattern 20D is connected (electrically connected) to the connection electrode 19C by an interlayer connection conductor (through hole conductor).

The second-principal-surface-side conductor patterns 20A to 20D, the connection electrodes 17A, 17B, 18A to 18C, and 19A to 19C, the first metal posts 30A to 30C, the connection conductors 50A to 50C, the second metal posts 40A to 40C, and the interlayer connection conductors define a three-turn helical coil antenna.

According to the present preferred embodiment, all of the first conductor patterns, which define portions of the helical coil antenna, are the second-principal-surface-side conductor patterns 20A, 20B, 20C, and 20D provided on the second principal surface of the first substrate 1. Therefore, the coil openings are larger than those in the case where the first conductor patterns are provided on the first principal surface of the first substrate 1. Therefore, communication is able to be performed by using the coil openings, and the communicable distance is increased.

As in the wireless IC device 101 according to the first preferred embodiment, all of the first conductor patterns, which constitute portions of the helical coil antenna, may instead be first-principal-surface-side conductor patterns.

Seventh Preferred Embodiment

Figure 14:
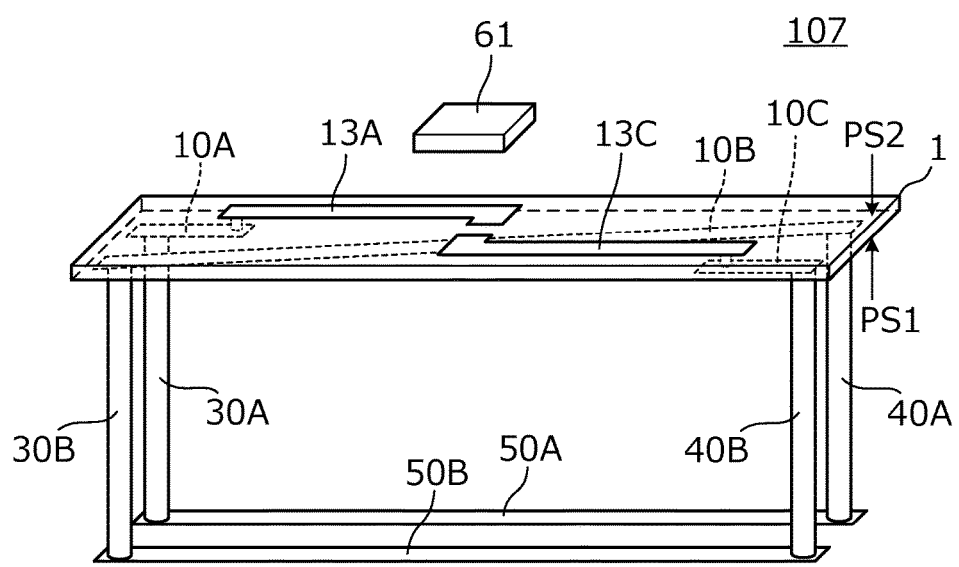
FIG. 14 is a perspective view of a wireless IC device 107 according to a seventh preferred embodiment of the present invention.

FIG. 14 is a perspective view of a wireless IC device 107 according to a seventh preferred embodiment of the present invention. Unlike the second preferred embodiment, in the present preferred embodiment, an RFIC element 61 is mounted on a second principal surface PS2 of a first substrate 1. FIG. 14 shows the state in which the RFIC element 61 is separated from the first substrate 1.

Power supply connection conductors 13A and 13C (second-principal-surface-side conductor patterns) are provided on the second principal surface PS2 of the first substrate 1. The power supply connection conductors 13A and 13C are electrically connected to first-principal-surface-side conductor patterns 10A and 10C, respectively, by plated through holes.

In the present preferred embodiment, first-principal-surface-side conductor patterns 10A, 10B, and 10C and the power supply connection conductors 13A and 13C illustrated in FIG. 14 correspond to the "first conductor pattern". In addition, in the present preferred embodiment, connection conductors 50A and 50B illustrated in FIG. 14 correspond to the "second conductor pattern".

Components other than the RFIC element 61, such as chip capacitors, may also be mounted on the second principal surface PS2 of the first substrate 1.

In this case, the characteristics of the coil antenna are able to be measured by connecting probes of a measurement device to the connecting portions of the RFIC element 61 before the RFIC element 61 is mounted. Therefore, the yield is increased.

Eighth Preferred Embodiment

Figure 15:
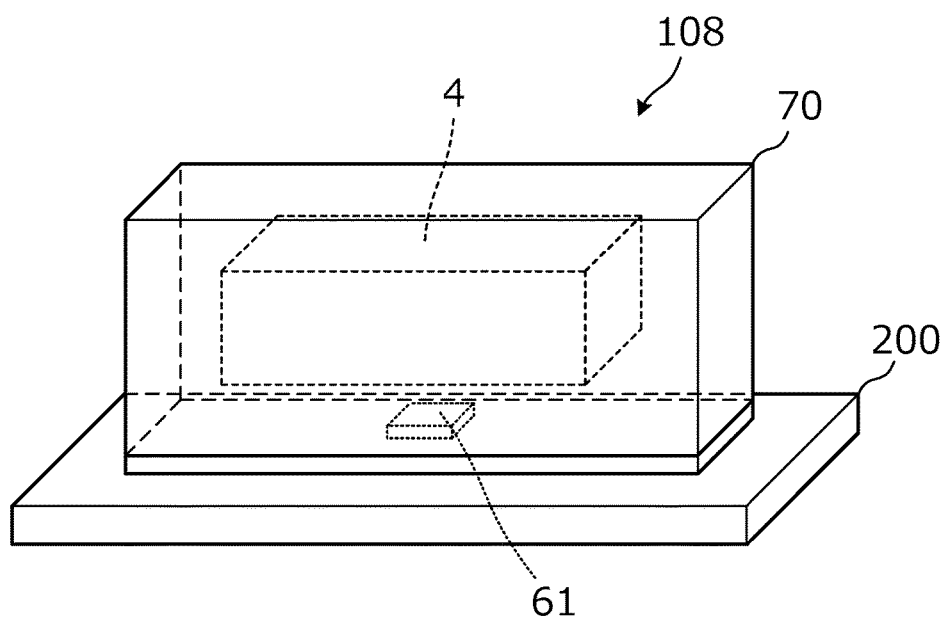
FIG. 15 is a perspective view of a wireless IC device 108 according to an eighth preferred embodiment of the present invention illustrating the manner in which the wireless IC device 108 is mounted on a circuit substrate 200.
Figure 16:
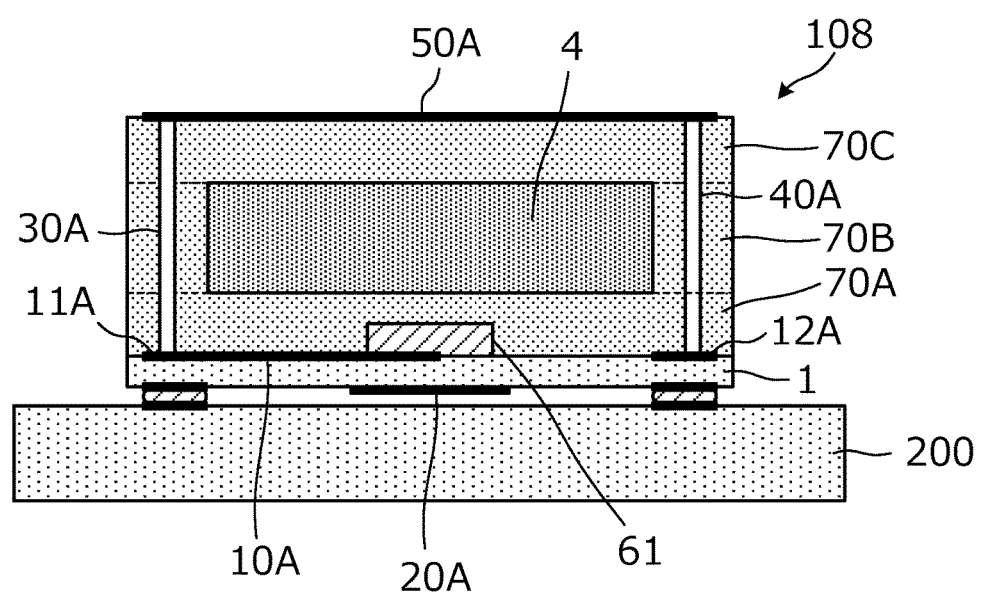
FIG. 16 is a sectional view illustrating the manner in which the wireless IC device 108 is mounted on the circuit substrate 200.

FIG. 15 is a perspective view of a wireless IC device 108 according to an eighth preferred embodiment of the present invention illustrating the manner in which the wireless IC device 108 is mounted on a circuit substrate 200. FIG. 16 is a sectional view illustrating the manner in which the wireless IC device 108 is mounted on the circuit substrate 200.

In the present preferred embodiment, a sintered-body-type magnetic core 4 include, for example, a ferrite sintered body that defines and functions as a magnetic core of the coil antenna is provided. In addition, a non-magnetic resin member includes resin layers 70A, 70B, and 70C. The other structures are the same as those described in the third preferred embodiment.

Figure 17:
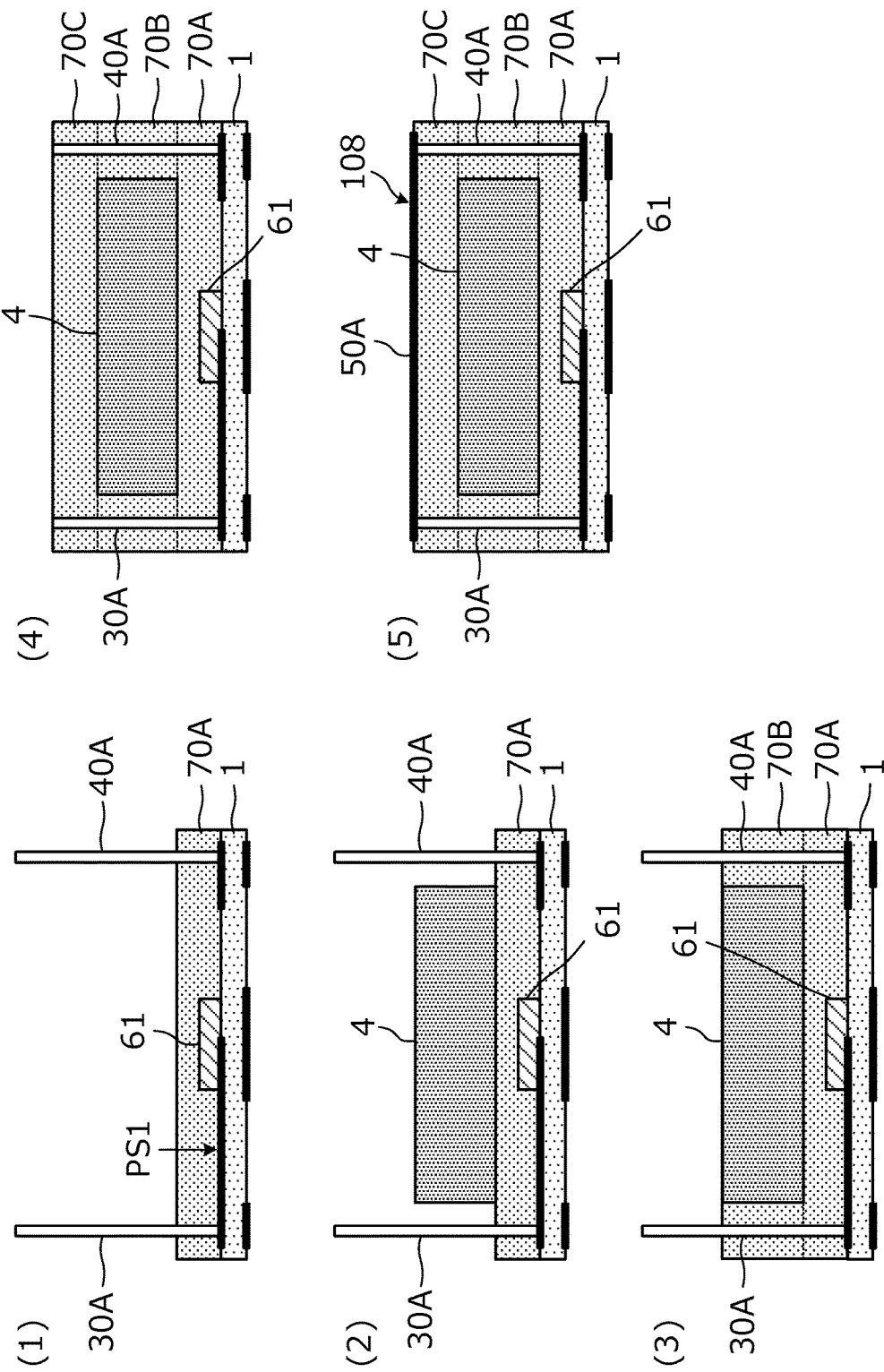
FIG. 17 is sectional view illustrating successive manufacturing steps of the wireless IC device 108.

FIG. 17 is sectional view illustrating successive manufacturing steps of the wireless IC device 108. The wireless IC device 108 is manufactured by, for example, the following steps.

As illustrated in part (1) of FIG. 17, a first substrate 1 is prepared, and an RFIC element 61 and metal posts (30A and 40A, etc.) are mounted on the first substrate 1.

After that, the surface of the first substrate 1 on which the RFIC element 61 is mounted (first principal surface PS1) is covered with the resin layer 70A, which is a non-magnetic body made of epoxy resin or the like.

As illustrated in part (2) of FIG. 17, after the resin layer 70A is hardened, the magnetic core 4, which has a rectangular or substantially rectangular parallelepiped shape, is mounted. The magnetic core 4 is preferably a small ferrite sintered body having a high magnetic permeability (for example, a relative magnetic permeability of about 50 to 300). The magnetic core 4 may be mounted before the resin layer 70A is hardened.

Next, as illustrated in part (3) of FIG. 17, the resin layer 70B, which is made of epoxy resin or the like, is formed so that the thickness thereof is the same or substantially the same as the thickness of the magnetic core 4.

Next, as illustrated in part (4) of FIG. 17, the resin layer 70C, which is made of epoxy resin or the like, is formed so as to extend to the same or substantially the same height as, for example, the metal posts (30A and 40A, etc.). More specifically, the epoxy resin or the like is applied so as to extend to a predetermined height (height greater than or equal to the height to which the metal posts (30A and 40A, etc.) extend), and then the surface of the resin layer 70C is ground in a planar manner so that head portions of the metal posts (30A and 40A, etc.) are exposed.

Next, as illustrated in part (5) of FIG. 17, connection conductors (50A, etc.) are formed on the surface of the resin layer 70C. The method for forming the connection conductors (50A, etc.) is preferably the same as that described in the third preferred embodiment.

The following steps of Cu plating, Au plating, formation of a protective resin film on which the connecting conductors (50A, etc.) are provided, and separation into individual pieces are the same as those described in the third preferred embodiment. The protective resin film (solder resist film) at the rear side of the first substrate 1 may be formed so as to cover portions excluding the portion connected to another substrate.

Figure 18:
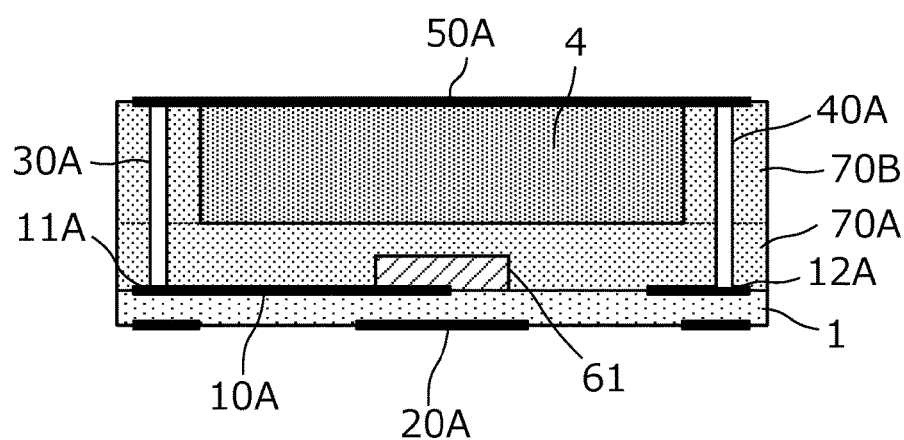
FIG. 18 is a sectional view of a wireless IC device according to another structural example of the eighth preferred embodiment of the present invention.

FIG. 18 is a sectional view of a wireless IC device according to another structural example of the present preferred embodiment. A comparison with FIG. 16 clearly shows that the resin layer 70C is not provided between the magnetic core 4 and the connection conductor (50A, etc.), and the resin layers 70A and 70B define the resin member. With this structure, a large magnetic core having a high magnetic permeability (for example, a relative magnetic permeability of about 50 to 300) is able to be embedded. Also, the height is able to be reduced by reducing the overall thickness of the resin member.

In the present preferred embodiment, the first metal posts (30A, etc.), the second metal posts (40A, etc.), the connection conductors (50A, etc.), the first-principal-surface-side conductor patterns (10A, etc.), and the second-principal-surface-side conductor patterns (20A, etc.) define a coil antenna, and the magnetic core is disposed in the coil antenna (in the winding area of the coil).

The present preferred embodiment provides the following effects.

A coil antenna having a predetermined inductance is able to be obtained without increasing the size of the coil antenna. Also, a predetermined inductance is able to be obtained even when the height of the coil antenna is reduced.

The magnetic field coupling between the coil antenna and an antenna that communicates with the coil antenna is able to be enhanced by the magnetism collecting effect of the magnetic core.

The noise generated when digital signals are input and output from the RFIC element 61 is hardly superposed on the coil antenna. The reason for this will now be described.

Since the first substrate 1 on which the RFIC element 61 is mounted is provided on the circuit substrate 200, the RFIC element 61 is closer to the circuit substrate 200 than in the case where the RFIC element 61 is mounted at the upper side of the resin member. Therefore, the line along which digital signals are transmitted from the RFIC element 61 is connected to a digital circuit on the circuit substrate 200 over a minimum distance. In other words, the distance between the coil antenna and the digital signals, which define and function as a noise source for an analog circuit, is significantly reduced or minimized. The RFIC element 61 and the coil antenna are also connected to each other over a minimum distance. Namely, the analog signal circuit and the digital signal circuit (circuit of the RFID system) are vertically separated from each other. Accordingly, the occurrence of unnecessary coupling between the magnetic field (noise) generated by the propagation of the digital signals and the coil antenna is low. Therefore, the noise is not superposed on the analog signal circuit, which is very weak, and the wireless communication is hardly adversely affected.

Ninth Preferred Embodiment

Figure 19:
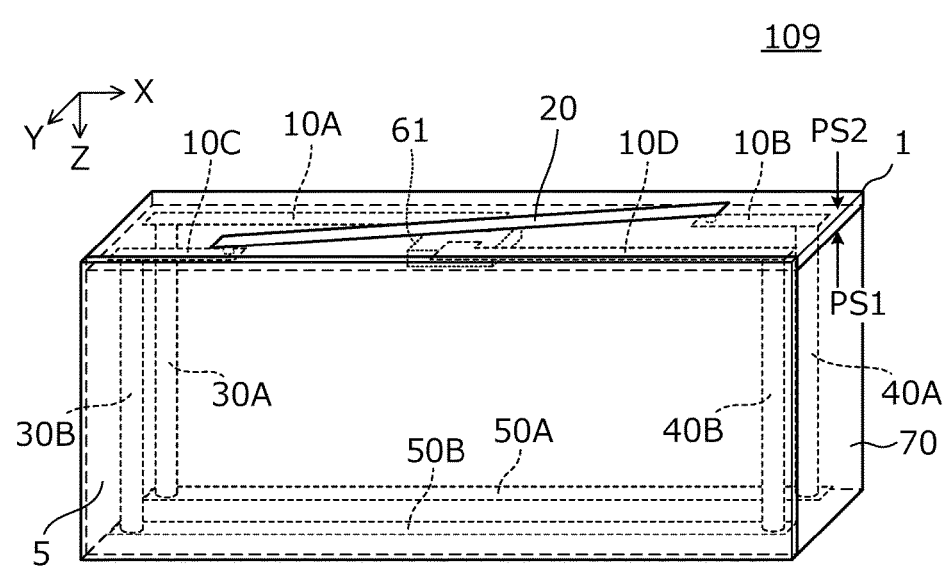
FIG. 19 is a perspective view of a wireless IC device 109 according to a ninth preferred embodiment of the present invention.

FIG. 19 is a perspective view of a wireless IC device 109 according to a ninth preferred embodiment of the present invention. The wireless IC device 109 includes a first substrate 1, metal posts 30A, 30B, 40A, and 40B, and connection conductors 50A and 50B having the same structures as those described in the second preferred embodiment. In the wireless IC device 109 according to the present preferred embodiment, after an RFIC element 61 is mounted on the first substrate 1, a resin member 70 is provided, and a magnetic sheet 5 is attached to a side surface of the resin member 70. The magnetic sheet 5 is, for example, a resin sheet made of a resin, such as epoxy resin, in which magnetic powder, such as ferrite powder, is dispersed.

In the present preferred embodiment, the first metal posts 30A and 30B, the second metal posts 40A and 40B, the connection conductors 50A and 50B, first-principal-surface-side conductor patterns 10A to 10D, and a second-principal-surface-side conductor pattern 20 define a coil antenna, and the magnetic sheet 5 is provided at one of the coil openings of this coil antenna.

In the present preferred embodiment, the first-principal-surface-side conductor patterns 10A to 10D and the second-principal-surface-side conductor pattern 20 correspond to the "first conductor pattern". In addition, in the present preferred embodiment, the connection conductors 50A and 50B correspond to the "second conductor pattern".

According to the present preferred embodiment, a coil antenna having a predetermined inductance is able to be obtained without increasing the size of the coil antenna. In addition, when this RFID device is bonded to an article (in particular, a metal surface of an article), the influence of the article on the coil antenna is able to be reduced by bonding the RFID device such that the side at which the magnetic sheet is provided faces the article. In addition, the magnetic field coupling between the coil antenna and an antenna that communicates with the coil antenna is able to be enhanced by the magnetism collecting effect of the magnetic core.

Tenth Preferred Embodiment

Figure 20:
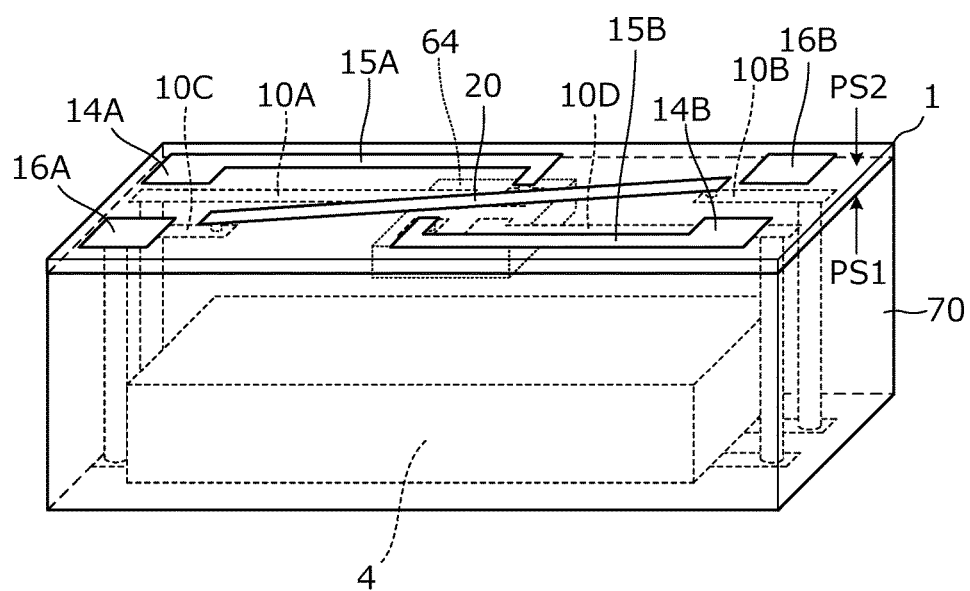
FIG. 20 is a perspective view of a wireless IC device 110 according to a tenth preferred embodiment of the present invention.
Figure 21:
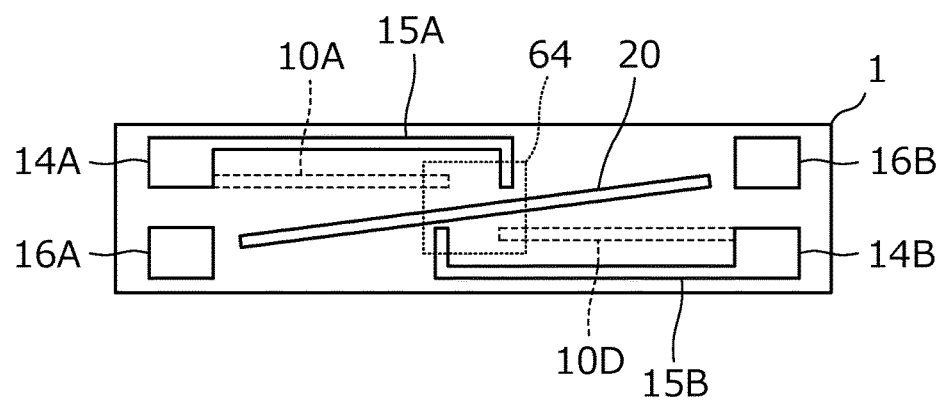
FIG. 21 is a plan view of the wireless IC device 110.

FIG. 20 is a perspective view of a wireless IC device 110 according to a tenth preferred embodiment of the present invention. FIG. 21 is a plan view of the wireless IC device 110. The wireless IC device 110 according to the present preferred embodiment is preferably used as an RFID reader/writer device, for example.

First-principal-surface-side conductor patterns 10A to 10D are provided on a first principal surface PS1 of a first substrate 1. Digital signal terminals 14A and 14B, NC terminals (Non-connected terminals) 16A and 16B, and wiring conductors 15A and 15B are provided on a second principal surface PS2 of the first substrate 1. Accordingly, an RFIC element 64 includes two antenna connection pads and two digital signal pads. One digital signal terminal of the RFIC element 64 is connected to the digital signal terminal 14A by an interlayer connection conductor (through hole conductor) in the first substrate 1 and the wiring conductor 15A. The other digital signal terminal of the RFIC element 64 is connected to the digital signal terminal 14B by an interlayer connection conductor (through hole conductor) in the first substrate 1 and the wiring conductor 15B. The other basic structures are the same as those in the wireless IC device 108 according to the eighth preferred embodiment.

In the present preferred embodiment, the first-principal-surface-side conductor patterns 10A, 10B, 10C, and 10D and the second-principal-surface-side conductor pattern 20 illustrated in FIG. 20 correspond to the "first conductor pattern".

Figure 22:
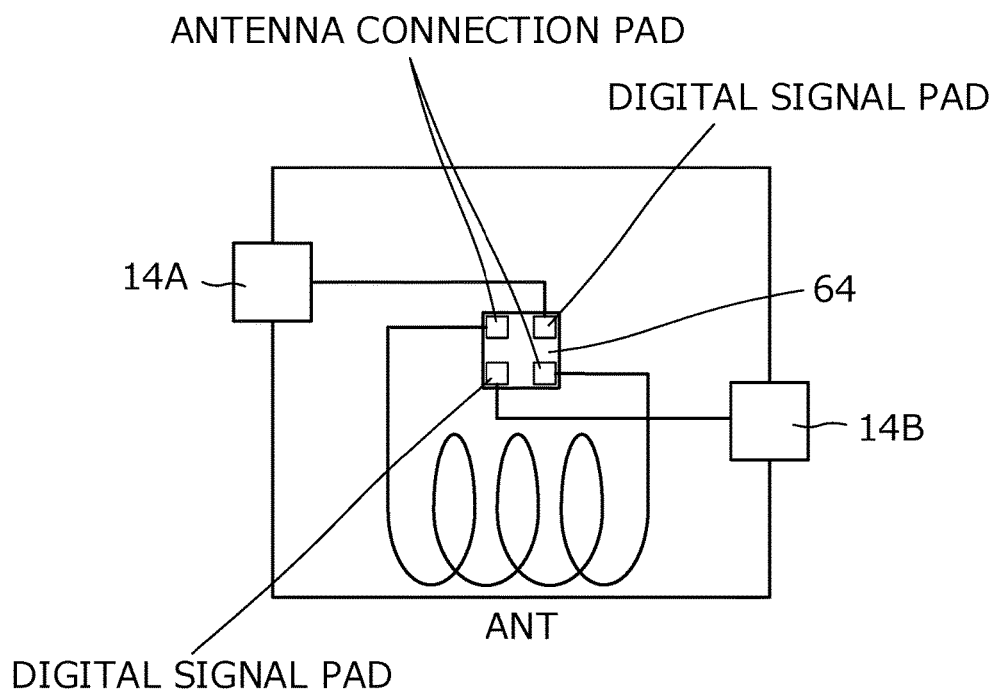
FIG. 22 is a circuit diagram of the wireless IC device 110.

FIG. 22 is a circuit diagram of the wireless IC device 110. A coil antenna ANT is connected to the antenna connection pads of the RFIC element 64, and the digital signal terminals 14A and 14B are connected to the digital signal pads of the RFIC element 64. A host device is connected to the digital signal terminals 14A and 14B. Thus, an RFID system reader/writer device is structured. The RFIC element 64 is connected to the host device by, for example, a serial bus based on the I²C bus standard.

The digital signal terminals 14A and 14B may be disposed near the digital signal pads of the RFIC element 64 so that the wiring conductors 15A and 15B are able to be substantially eliminated.

The wireless IC device 110 may be subjected to barrel finishing or electroless nickel gold plating as necessary. When these processes are performed, plating films are formed on the surfaces of the connection conductors, the second-principal-surface-side conductor pattern 20, the digital signal terminals 14A and 14B, the NC terminals (Non-connected terminals) 16A and 16B, etc., so that the film thickness thereof is increased and the DCR thereof is reduced. Therefore, the conductor loss is reduced. In addition, the environment resistance of the wireless IC device 110 is increased.

Eleventh Preferred Embodiment

Figure 23:
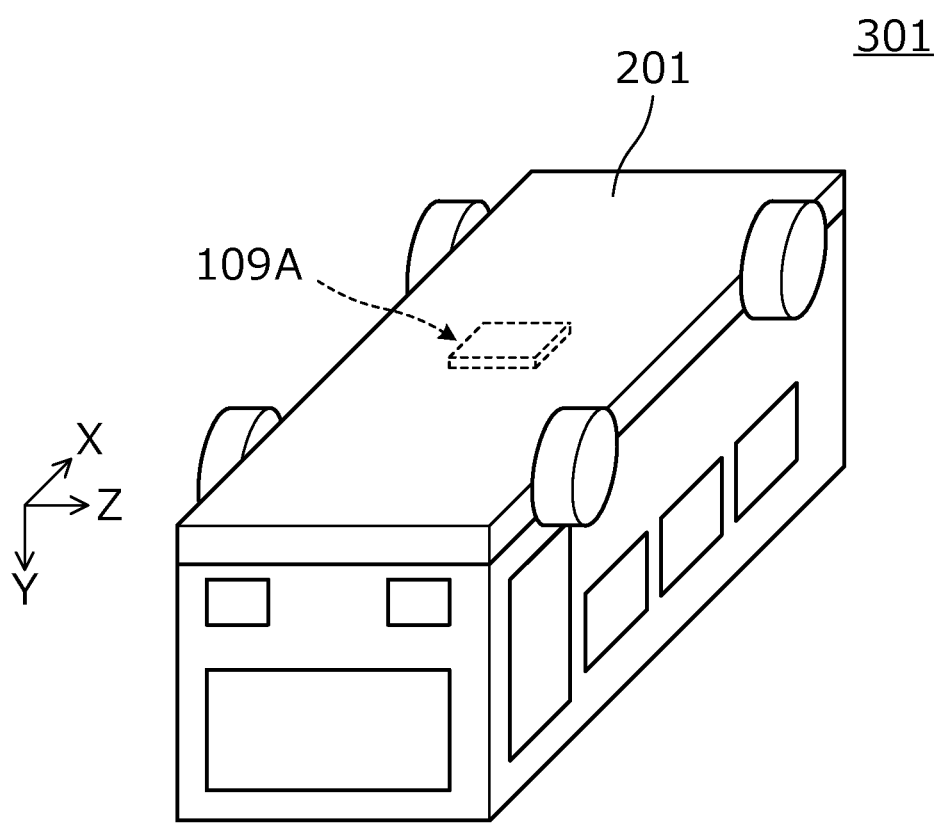
FIG. 23 is a perspective view of an article 301 in which an RFID tag is disposed according to an eleventh preferred embodiment of the present invention.
Figure 24:
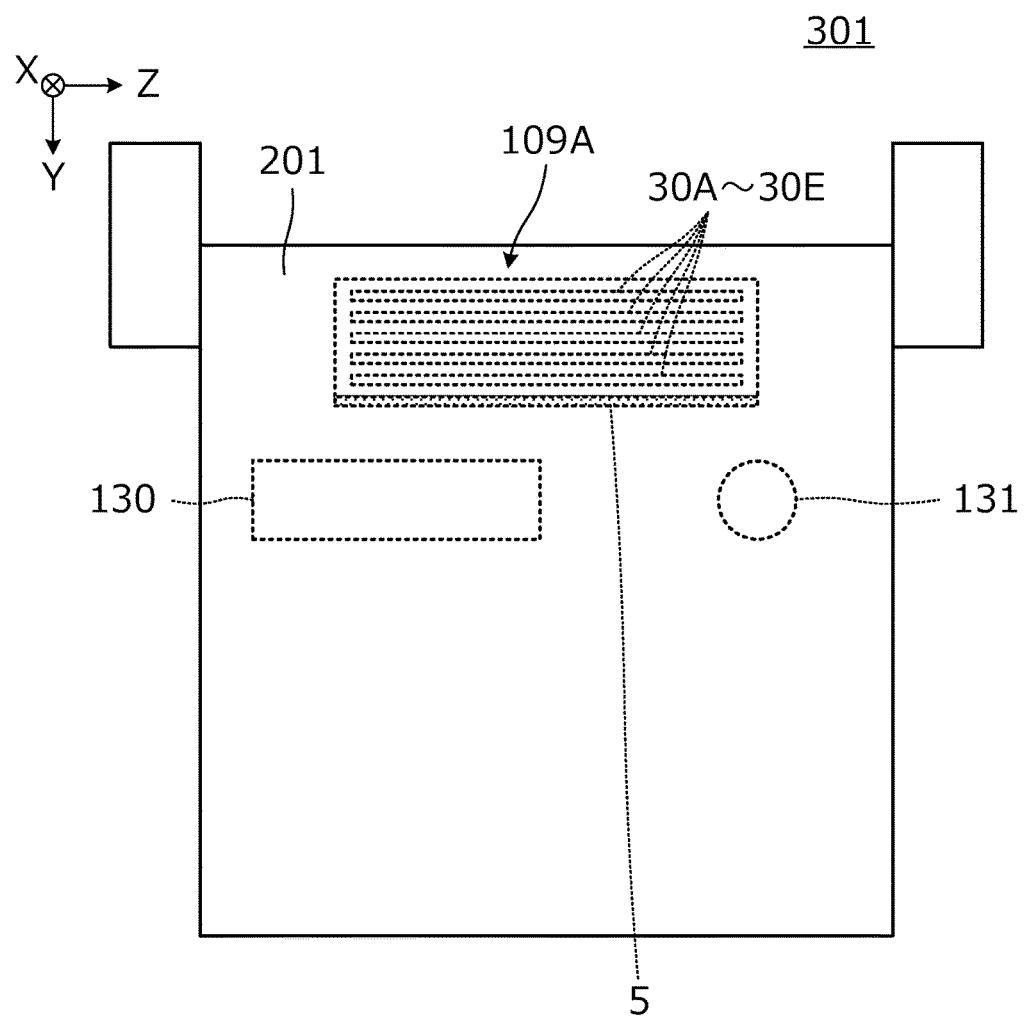
FIG. 24 is a front view of the article 301 in which the RFID tag is disposed.

FIG. 23 is a perspective view of an article 301 having an RFID tag according to an eleventh preferred embodiment of the present invention. FIG. 24 is a front view of the article 301 having the RFID tag. The article 301 having the RFID tag is a toy, such as a miniature car, formed by resin molding. The article 301 having the RFID tag corresponds to a "molded resin article".

The article 301 having the RFID tag includes a wireless IC device 109A. The basic structure of the wireless IC device 109A is the same as that of the wireless IC device 109 according to the ninth preferred embodiment. The wireless IC device 109A according to the present preferred embodiment includes a coil antenna including first metal posts 30A to 30E, and the number of turns of the coil antenna is "5". The wireless IC device 109A is used as the RFID tag.

The wireless IC device 109A is embedded in a molded resin article 201, and is not exposed to the outside of the article 301. Resin injection molding is performed while the wireless IC device 109A is fixed to a mold use to form the molded resin article 201 by injection molding. The wireless IC device 109A is embedded in a bottom portion of the toy (at a position near the top surface of the article 301 having the RFID tag disposed therein in FIG. 23). The magnetic sheet 5 of the wireless IC device 109A is located closer to the inside (inner region) of the molded resin article 201 than the coil antenna. Conductors such as a battery pack 130 and a metal member 131 are disposed in the molded resin article 201. Since the magnetic sheet 5 is disposed between these conductors and the coil antenna, the coil antenna is not easily affected by the conductors, and loss due to an eddy current is reduced.

The RFIC element 61 and the metal posts 30A to 30E and 40A to 40E are protected by the resin member 70, and therefore the wireless IC device 109A is durable. In addition, solder connecting portions of the surface mount chip components and the metal posts are protected from high-temperature resin that flows during injection molding. More specifically, even when the solder of the solder connecting portions of the surface mount chip components and the metal posts is melted once due to the heat applied during injection molding, the positional relationships between the surface mount chip components, such as the RFIC element 61, and the first substrate 1 and between the metal posts and the first substrate 1 are continuously fixed by the resin member 70. For example, although the temperature of the mold for injection molding is about several tens of degrees above 100° C., the temperature at the distal end of the injection molding nozzle is as high as several tens of degrees above about 300° C. Therefore, there is a possibility that the solder of the solder connecting portions of the surface mount chip components and the metal posts will be melted once. However, even when the solder is melted once, the positional relationships between the surface mount chip components and the first substrate 1 and between the metal posts and the first substrate 1 are fixed by the resin member 70. Therefore, the solder connecting portions of the surface mount chip components and the metal posts return to the connecting state before injection molding after they are cooled. If a common wire-wound coil component in which a Cu wire coated with a polyimide based resin film is wound is used, the coating will be melted due to the heat applied during injection molding, and short-circuiting between portions of the Cu wire may occur. Therefore, it is difficult to use a common wire-wound coil component as a coil antenna.

The winding axis of the coil antenna of the wireless IC device 109A extends in the normal direction to the bottom surface of the toy, such as a miniature car. Therefore, when the bottom surface of the toy is placed so as to face a reading unit of a reader/writer device, the reader/writer device communicates with the wireless IC device 109A. Thus, the reader/writer device or a host device connected to the reader/writer device performs a predetermined process.

In the present preferred embodiment, a toy formed by resin molding is described as an example of the article 301 having the RFID tag. However, the article having the RFID tag is not limited to this, and may instead be, for example, a container for food or the like in which a wireless IC device is embedded by resin molding.

Twelfth Preferred Embodiment

Figure 25:
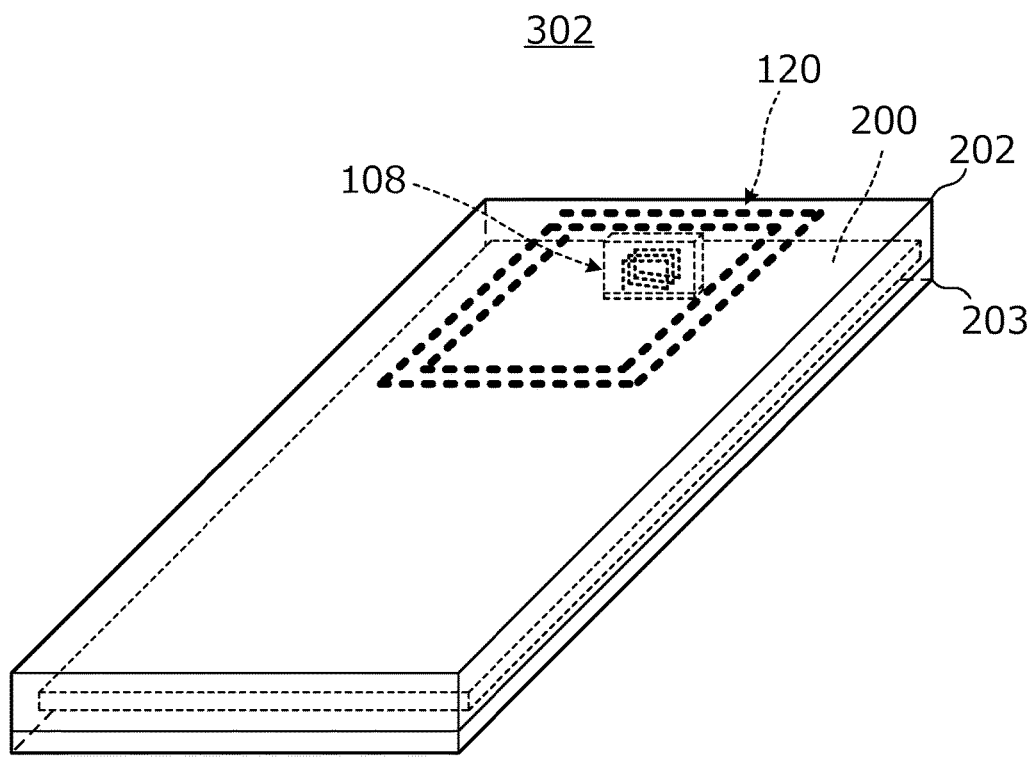
FIG. 25 is a perspective view of an article 302 in which an RFID tag is disposed according to a twelfth preferred embodiment of the present invention.
Figure 26:
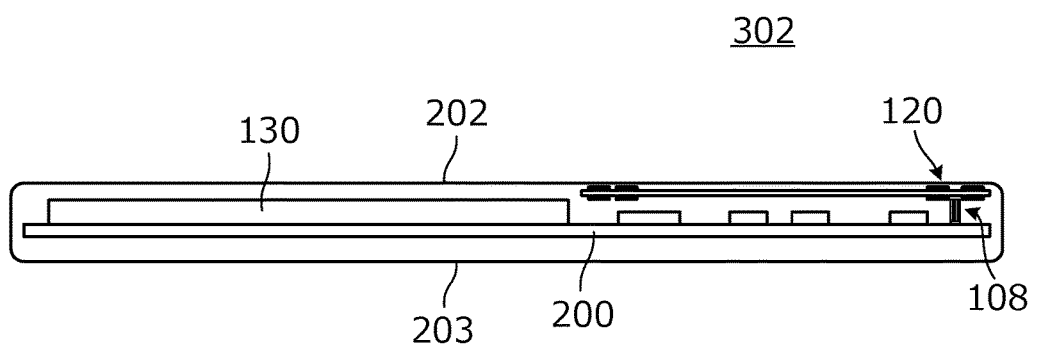
FIG. 26 is a sectional view of the article 302 in which the RFID tag is disposed.
Figure 27:
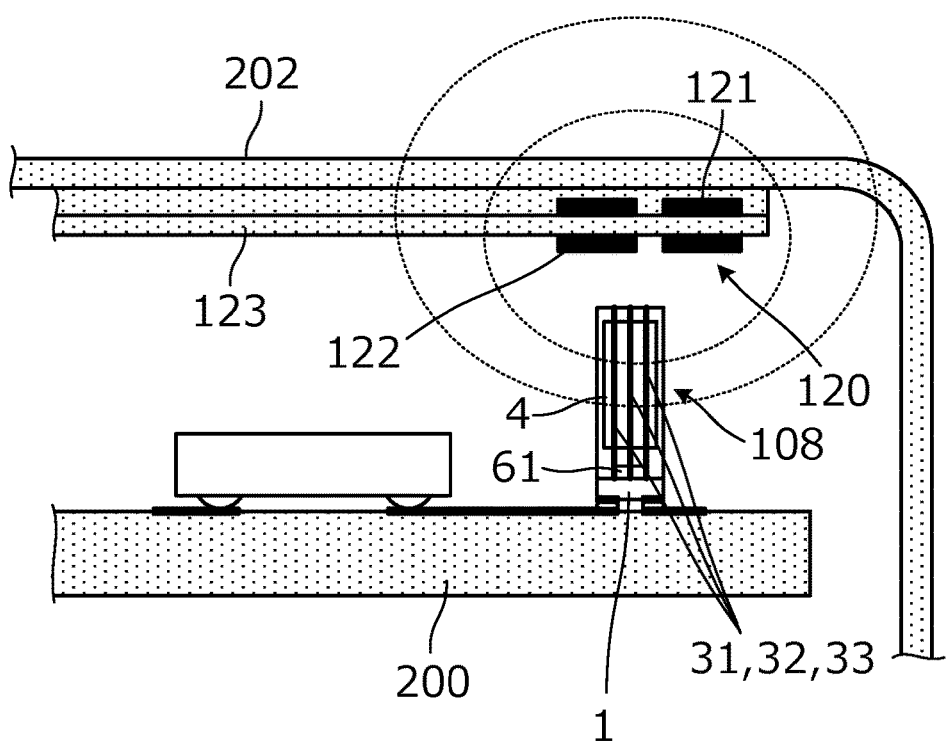
FIG. 27 is a partial enlarged view of FIG. 26.

FIG. 25 is a perspective view of an article 302 in which an RFID tag is disposed according to a twelfth preferred embodiment of the present invention. FIG. 26 is a sectional view of the article 302 in which the RFID tag is disposed. FIG. 27 is a partial enlarged view of FIG. 26.

The article 302 in which the RFID tag is disposed is, for example, a portable electronic device such as a smart phone, and includes the wireless IC device 108 and a booster antenna 120 having a resonant frequency. The article 302 in which the RFID tag is disposed includes a lower housing 202 at the upper side in FIG. 25 and an upper housing 203 at the lower side in FIG. 25. A circuit substrate 200, the wireless IC device 108, and the booster antenna 120 having a resonant frequency are disposed in the space surrounded by the lower housing 202 and the upper housing 203.

The wireless IC device 108 is structured as described in the eighth preferred embodiment. As illustrated in FIGS. 26 and 27, the wireless IC device 108 is mounted on a circuit substrate 200. Components other than the wireless IC device 108 are also mounted on the circuit substrate 200.

The booster antenna 120 having a resonant frequency is attached to an inner surface of the lower housing 202. The booster antenna 120 is disposed at a location where the booster antenna 120 does not overlap the battery pack 130. The booster antenna 120 includes an insulator substrate 123 and coil patterns 121 and 122 provided on the insulator substrate 123.

The wireless IC device 108 is arranged so that the magnetic flux is linked with the coil antenna thereof and the booster antenna 120. More specifically, the wireless IC device 108 and the booster antenna 120 are arranged so that magnetic field coupling occurs between the coil antenna of the wireless IC device 108 and the coil of the booster antenna 120. In FIG. 27, the dashed lines conceptually indicate the magnetic flux that contributes to the magnetic field coupling.

The RFIC element 61 of the wireless IC device 108 faces (is adjacent to) the circuit substrate 200, and the coil antenna of the wireless IC device 108 faces (is adjacent to) the booster antenna 120. Therefore, the degree of coupling between the coil antenna of the wireless IC device 108 and the booster antenna 120 is high. Wires that connect the RFIC element 61 to other circuit elements (in particular, digital signal line and power supply line) are arranged so as to be parallel or substantially parallel to the magnetic flux of the coil antenna. Therefore, the degree of coupling between the wires and the coil antenna is low.

Figure 28:
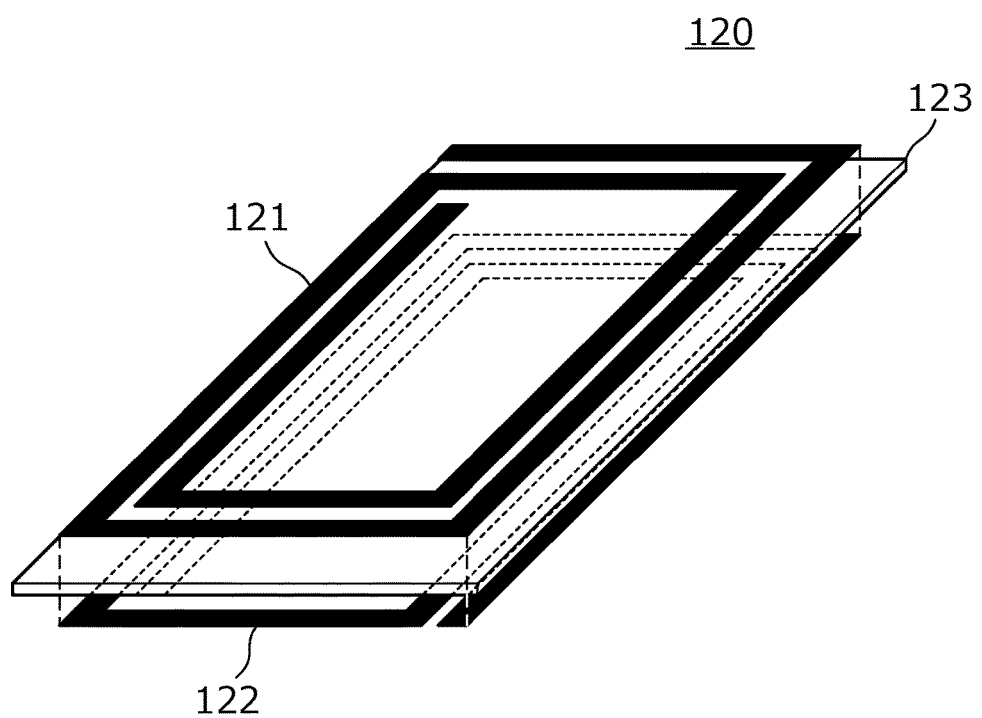
FIG. 28 is a perspective view of a booster antenna 120.
Figure 29:
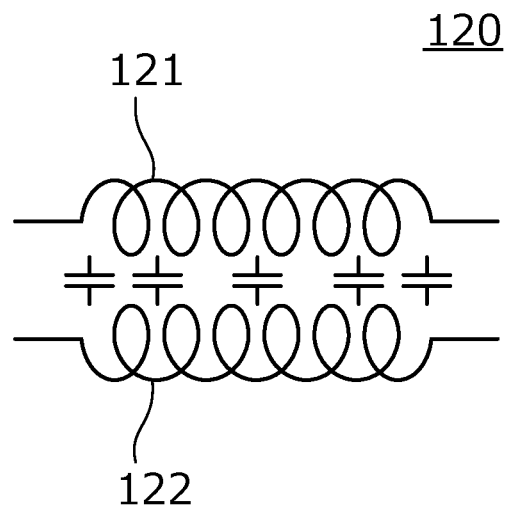
FIG. 29 is a circuit diagram of the booster antenna 120.

FIG. 28 is a perspective view of the booster antenna 120. FIG. 29 is a circuit diagram of the booster antenna 120. In the booster antenna 120, the first coil pattern 121 and the second coil pattern 122 are conductors provided in a rectangular or substantially rectangular spiral pattern so that capacitive coupling is achieved when currents flow therethrough in the same direction in plan view. A stray capacitance is generated between the first coil pattern 121 and the second coil pattern 122. The inductances of the first coil pattern 121 and the second coil pattern 122 and the stay capacitance define an LC resonant circuit. The resonant frequency of the LC resonant circuit is equal or substantially equal to the communication frequency of the RFID system. The communication frequency is, for example, 13.56 MHz band.

In the present preferred embodiment, communication is carried out by using large coil openings of the booster antenna. Therefore, the maximum distance over which communication is able to be carried out is increased.

The above-described preferred embodiments are illustrative in all points and are not limiting. It is clear that a person skilled in the art can make changes and modifications within the scope of the present invention. For example, the structures of different preferred embodiments may be partially replaced or combined together. The scope of the present invention is defined not by the above-described preferred embodiments, but by the claims. In addition, the scope of the present invention is intended to include equivalents to the scope of the claims and all modifications within the scope of the claims.

For example, the frequency band of the coil antenna (the RFID tag) is not limited to HF-band, and may instead be LF-band, UHF-band, or SHF-band. The article to which the RFID tag is attached is not limited to a toy, and may instead be, for example, a portable information terminal, such as a cellular phone, a building material, such as a scaffolding material, or an industrial material, such as a gas cylinder.

In the above-described preferred embodiments, the RFIC element 61 is preferably mounted on the first principal surface PS1 or the second principal surface PS2 of the first substrate 1. However, the structure is not limited to this. The RFIC element 61 may instead be, for example, disposed in the first substrate 1. Alternatively, a cavity may be provided in the first principal surface PS1 or the second principal surface PS2 of the first substrate 1, and the RFIC element may be disposed in the cavity.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A wireless IC device comprising:
a coil antenna;
an RFIC element connected to the coil antenna;
a printed wiring board including a first principal surface and a second principal surface; and
a resin member adjacent to the first principal surface of the printed wiring board; wherein
the coil antenna includes:
a first conductor pattern provided on the printed wiring board;
a first metal post that includes a first end and a second end and extends in a normal direction to the first principal surface of the printed wiring board, the first end being electrically connected to the first conductor pattern, the first metal post being embedded in the resin member;
a second metal post that includes a first end and a second end and extends in the normal direction to the first principal surface of the printed wiring board, the first end being electrically connected to the first conductor pattern, the second metal post being embedded in the resin member; and
a second conductor pattern provided on the resin member and including a first end that is electrically connected to the second end of the first metal post and a second end that is electrically connected to the second end of the second metal post; wherein
the coil antenna has a winding axis that extends in a direction along the first principal surface of the printed wiring board; and
the RFIC element is adjacent to the first principal surface of the printed wiring board, disposed between the first metal post and the second metal post, and embedded in the resin member.

2. The wireless IC device according to claim 1, further comprising a magnetic body disposed in the coil antenna.

3. The wireless IC device according to claim 1, wherein the first conductor pattern includes a first-principal-surface-side conductor pattern provided on the first principal surface of the printed wiring board, and a second-principal-surface-side conductor pattern provided on the second principal surface of the printed wiring board; and
the RFIC element is mounted on the first principal surface of the printed wiring board, and is connected to a portion of the first-principal-surface-side conductor pattern.

4. The wireless IC device according to claim 3, wherein the first-principal-surface-side conductor pattern, the first metal post, and the second metal post are provided in a plurality;
the second-principal-surface-side conductor pattern is connected in series to the first-principal-surface-side conductor patterns;
the first-principal-surface-side conductor patterns and the second-principal-surface-side conductor pattern extend in an X-axis direction of an orthogonal X-Y-Z coordinate system;
the first metal posts are arranged in a Y-axis direction of the orthogonal X-Y-Z coordinate system and extend in a Z-axis direction of the orthogonal X-Y-Z coordinate system;
the second metal posts are arranged in the Y-axis direction of the orthogonal X-Y-Z coordinate system and extend in the Z-axis direction of the orthogonal X-Y-Z coordinate system; and
the first metal posts, the second conductor pattern, the second metal posts, the first-principal-surface-side conductor patterns, and the second-principal-surface-side conductor pattern define a helical coil.

5. The wireless IC device according to claim 4, wherein the second-principal-surface-side conductor pattern is provided in a plurality;
a number of the first-principal-surface-side conductor patterns, a number of the first metal posts, and a number of the second metal posts are each 3 or more, and a number of the second-principal-surface-side conductor patterns is 2 or more; and
the first metal posts and the second metal posts are arranged in the Y-axis direction and disposed in a staggered pattern when viewed in the Z-axis direction.

6. The wireless IC device according to claim 5, wherein the helical coil includes a plurality of types of loops with different inner diameters, and two loops at opening surfaces of the helical coil are loops of one of the plurality of types of loops that has a largest inner diameter.

7. The wireless IC device according to claim 3, wherein a film thickness of the second-principal-surface-side conductor pattern is greater than a film thickness of the first-principal-surface-side conductor pattern.

8. The wireless IC device according to claim 1, further comprising a capacitor connected to the RFIC element.

9. The wireless IC device according to claim 1, wherein the RFIC element includes, in addition to an input-output terminal for a radio signal that is connected to the coil antenna, a digital signal terminal connected to an external digital circuit; and
a terminal that is electrically connected to the digital signal terminal and connected to the external digital circuit is provided on the printed wiring board.

10. A molded resin article in which a wireless IC device is embedded, wherein
the wireless IC device includes:
a coil antenna;
an RFIC element connected to the coil antenna;
a printed wiring board including a first principal surface and a second principal surface; and
a resin member adjacent to the first principal surface of the printed wiring board; wherein
the coil antenna includes:
a first conductor pattern provided on the printed wiring board;
a first metal post that includes a first end and a second end and extends in a normal direction to the first principal surface of the printed wiring board, the first end being electrically connected to the first conductor pattern, the first metal post being embedded in the resin member;
a second metal post that includes a first end and a second end and extends in the normal direction to the first principal surface of the printed wiring board, the first end being electrically connected to the first conductor pattern, the second metal post being embedded in the resin member; and
a second conductor pattern provided on the resin member and including a first end connected to the second end of the first metal post and a second end connected to the second end of the second metal post; wherein the coil antenna has a winding axis that extends in a direction along the first principal surface of the printed wiring board; and the RFIC element is adjacent to the first principal surface of the printed wiring board, disposed between the first metal post and the second metal post, and embedded in the resin member.

11. The molded resin article according to claim 10, wherein the wireless IC device further includes a magnetic body disposed in the coil antenna.

12. The molded resin article according to claim 10, wherein the first conductor pattern includes a first-principal-surface-side conductor pattern provided on the first principal surface of the printed wiring board, and a second-principal-surface-side conductor pattern provided on the second principal surface of the printed wiring board; and the RFIC element is mounted on the first principal surface of the printed wiring board, and is connected to a portion of the first-principal-surface-side conductor pattern.

13. The molded resin article according to claim 12, wherein the first-principal-surface-side conductor pattern, the first metal post, and the second metal post are provided in a plurality;

the second-principal-surface-side conductor pattern is connected in series to the first-principal-surface-side conductor patterns;

the first-principal-surface-side conductor patterns and the second-principal-surface-side conductor pattern extend in an X-axis direction of an orthogonal X-Y-Z coordinate system;

the first metal posts are arranged in a Y-axis direction of the orthogonal X-Y-Z coordinate system and extend in a Z-axis direction of the orthogonal X-Y-Z coordinate system;

the second metal posts are arranged in the Y-axis direction of the orthogonal X-Y-Z coordinate system and extend in the Z-axis direction of the orthogonal X-Y-Z coordinate system; and the first metal posts, the second conductor pattern, the second metal posts, the first-principal-surface-side conductor patterns, and the second-principal-surface-side conductor pattern define a helical coil.

14. The molded resin article according to claim 13, wherein the second-principal-surface-side conductor pattern is provided in a plurality;

a number of the first-principal-surface-side conductor patterns, a number of the first metal posts, and a number of the second metal posts are each 3 or more, and a number of the second-principal-surface-side conductor patterns is 2 or more; and the first metal posts and the second metal posts are arranged in the Y-axis direction and disposed in a staggered pattern when viewed in the Z-axis direction.

15. The molded resin article according to claim 14, wherein the helical coil includes a plurality of types of loops with different inner diameters, and two loops at opening surfaces of the helical coil are loops of one of the plurality of types of loops that has a largest inner diameter.

16. The molded resin article according to claim 10, wherein a film thickness of the second-principal-surface-side conductor pattern is greater than a film thickness of the first-principal-surface-side conductor pattern.

17. The molded resin article according to claim 10, wherein the wireless IC device further includes a capacitor connected to the RFIC element.

18. The molded resin article according to claim 10, wherein the RFIC element includes, in addition to an input-output terminal for a radio signal that is connected to the coil antenna, a digital signal terminal connected to an external digital circuit; and a terminal that is electrically connected to the digital signal terminal and connected to the external digital circuit is provided on the printed wiring board.

* * * * *